(12) United States Patent
Oh et al.

(10) Patent No.: US 11,800,667 B2
(45) Date of Patent: Oct. 24, 2023

(54) ANTENNA AND ELECTRONIC DEVICE INCLUDING SAME

(71) Applicant: Samsung Electronics Co., Ltd., Suwon-si (KR)

(72) Inventors: Myeongsu Oh, Suwon-si (KR); Yongyoun Kim, Suwon-si (KR); Jaesung Shim, Suwon-si (KR); Hojin Jung, Suwon-si (KR); Duho Chu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 230 days.

(21) Appl. No.: 17/413,279

(22) PCT Filed: Dec. 11, 2019

(86) PCT No.: PCT/KR2019/017498
§ 371 (c)(1),
(2) Date: Jun. 11, 2021

(87) PCT Pub. No.: WO2020/122598
PCT Pub. Date: Jun. 18, 2020

(65) Prior Publication Data
US 2022/0061175 A1 Feb. 24, 2022

(30) Foreign Application Priority Data
Dec. 12, 2018 (KR) .................. 10-2018-0160098

(51) Int. Cl.
*H05K 5/02* (2006.01)
*H04B 1/40* (2015.01)
(Continued)

(52) U.S. Cl.
CPC ............. *H05K 5/0226* (2013.01); *H04B 1/40* (2013.01); *H05K 5/0017* (2013.01); *H05K 5/03* (2013.01); *H04M 1/0268* (2013.01)

(58) Field of Classification Search
None
See application file for complete search history.

(56) References Cited

U.S. PATENT DOCUMENTS 8,482,469 B2 7/2013 Ayala et al.
10,838,466 B2 * 11/2020 Rittenhouse ............ G06F 1/203
(Continued)

FOREIGN PATENT DOCUMENTS

CN 1783739 A 6/2006
CN 108352601 A 7/2018
(Continued)

OTHER PUBLICATIONS

Korean Office Action with English translation dated Dec. 14, 2022; Korean Appln. No. 10-2018-0160098.
(Continued)

*Primary Examiner* — Xanthia C Cunningham
(74) *Attorney, Agent, or Firm* — Jefferson IP Law, LLP

(57) ABSTRACT

According to an embodiment of the present invention, an electronic device may include: a foldable housing including a hinge structure, a first housing structure, and a second housing structure, wherein the hinge structure includes at least one first conductive portion, the first housing structure is connected to the hinge structure and includes a first surface oriented in a first direction, a second surface oriented in a second direction opposite the first direction, and a first side member surrounding at least a part of a space between the first surface and the second surface and including at least one second conductive portion, the second housing structure is connected to the hinge structure, includes a third surface
(Continued)

oriented in a third direction, a fourth surface oriented in a fourth direction opposite the third direction, and a second side member surrounding at least a part of a space between the third surface and the fourth surface, and is folded onto the first housing structure about the hinge structure, the first surface faces the third surface in a folded state of the foldable housing, and the third direction is identical to the first direction in an unfolded state of the foldable housing; a flexible display extending from the first surface to the third surface; and a wireless communication circuit electrically connected to the first conductive portion in the folded state of the foldable housing, and electrically connected to the second conductive portion in the unfolded state of the foldable housing, wherein the wireless communication circuit is configured to transmit and/or receive a signal having a selected frequency. Various other embodiments may be possible.

15 Claims, 17 Drawing Sheets

(51) Int. Cl.
*H05K 5/00* (2006.01)
*H05K 5/03* (2006.01)
*H04M 1/02* (2006.01)

(56) References Cited

U.S. PATENT DOCUMENTS

| | | |
|---|---|---|
| 2002/0113741 A1 | 8/2002 | Asano et al. |
| 2005/0026660 A1 | 2/2005 | Park et al. |
| 2005/0287959 A1 | 12/2005 | Park et al. |
| 2006/0118625 A1 | 6/2006 | Sekita |
| 2007/0238497 A1 | 10/2007 | Komine |
| 2008/0100514 A1* | 5/2008 | Abdul-Gaffoor ...... H01Q 1/243 343/702 |
| 2009/0149231 A1* | 6/2009 | Sato ..................... H01Q 1/44 455/575.7 |
| 2010/0013720 A1* | 1/2010 | Sakata .................. H01Q 1/243 343/702 |
| 2010/0147581 A1* | 6/2010 | Mitomi ............... H04M 1/0274 174/254 |
| 2011/0057847 A1 | 3/2011 | Iwai et al. |
| 2012/0098712 A1* | 4/2012 | Ishibana .................. H01Q 1/44 343/702 |
| 2012/0176293 A1* | 7/2012 | Itho .......................... H01Q 5/50 343/848 |
| 2012/0194394 A1* | 8/2012 | Togashi .................. H01Q 13/10 343/702 |
| 2014/0097992 A1 | 4/2014 | Cheng et al. |
| 2016/0154438 A1* | 6/2016 | Sato ....................... G06F 1/1626 361/679.1 |
| 2017/0141455 A1* | 5/2017 | Lin ........................ H01Q 21/28 |
| 2017/0257146 A1* | 9/2017 | Szeto ..................... H04W 4/80 |
| 2017/0351297 A1 | 12/2017 | Kim et al. |
| 2017/0374749 A1 | 12/2017 | Lee et al. |
| 2018/0210499 A1* | 7/2018 | Tsubaki ................ G06F 1/1616 |
| 2018/0246546 A1* | 8/2018 | Ghosh ................... G06F 1/1643 |
| 2018/0347921 A1* | 12/2018 | Morrison ............ H01L 23/3733 |
| 2019/0041922 A1* | 2/2019 | Kurma Raju .......... G06F 1/1637 |
| 2019/0140342 A1 | 5/2019 | Lim et al. |
| 2019/0354148 A1* | 11/2019 | Delano .................... G06F 1/203 |
| 2020/0136231 A1 | 4/2020 | Lee et al. |
| 2020/0333855 A1 | 10/2020 | Kim et al. |

FOREIGN PATENT DOCUMENTS

| | | |
|---|---|---|
| JP | 2006-197418 A | 7/2006 |
| JP | 2009-171142 A | 7/2009 |
| JP | 2009-177844 A | 8/2009 |
| JP | 2012-156862 A | 8/2012 |
| KR | 10-0617861 B1 | 8/2006 |
| KR | 10-1586288 B1 | 1/2016 |
| KR | 10-2017-0120985 A | 11/2017 |
| KR | 10-2018-0001818 A | 1/2018 |
| KR | 10-1820470 B1 | 1/2018 |
| KR | 10-2020-0046303 A | 5/2020 |
| KR | 10-2020-0100986 A | 8/2020 |
| WO | 2020/054883 A1 | 3/2002 |
| WO | 2020/085791 A1 | 4/2020 |

OTHER PUBLICATIONS

European Search Report dated Feb. 1, 2023; European Appln. No. 19 894 892.9-1224.
Korean Notice of Patent Grant with English translation dated Jun. 26, 2023, 2022; Korean Appln. No. 10-2018-0160098.
Chinese Office Action with English translation dated Jun. 29, 2023, 2022; Chinese Appln. No. 201980082499.6.
European Intention to Grant dated Jul. 17, 2023; European Appln. No. 19 894 892.9-1224.

\* cited by examiner

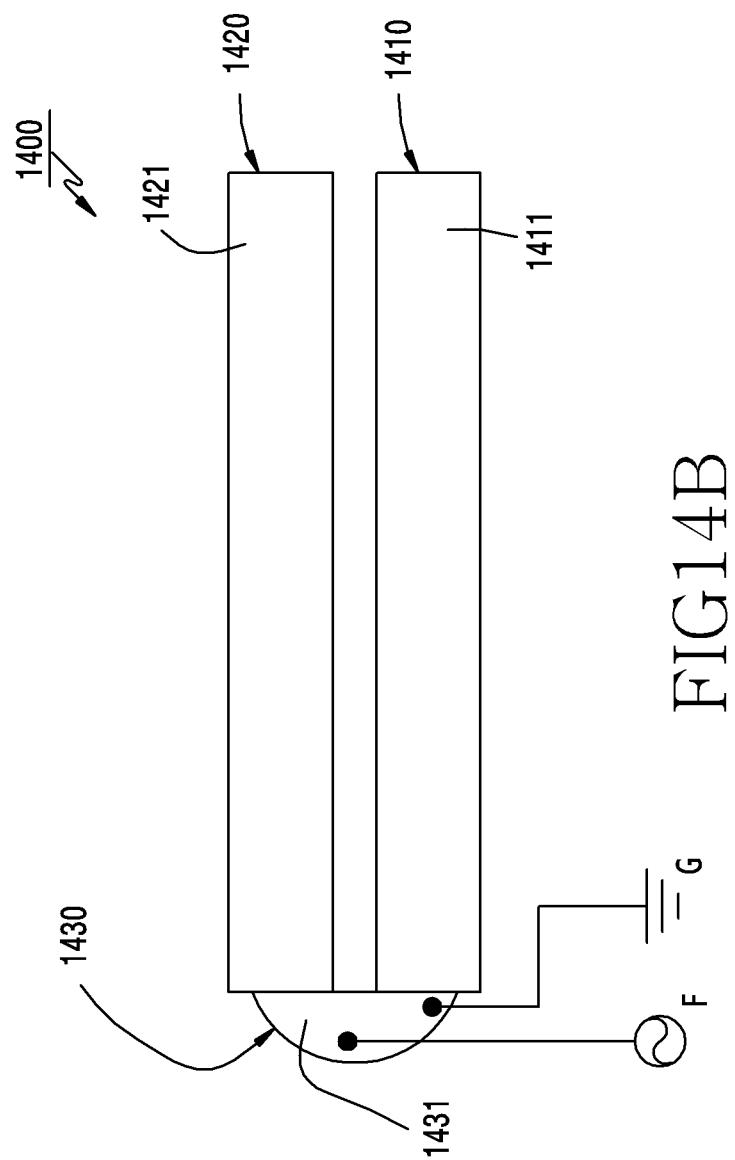

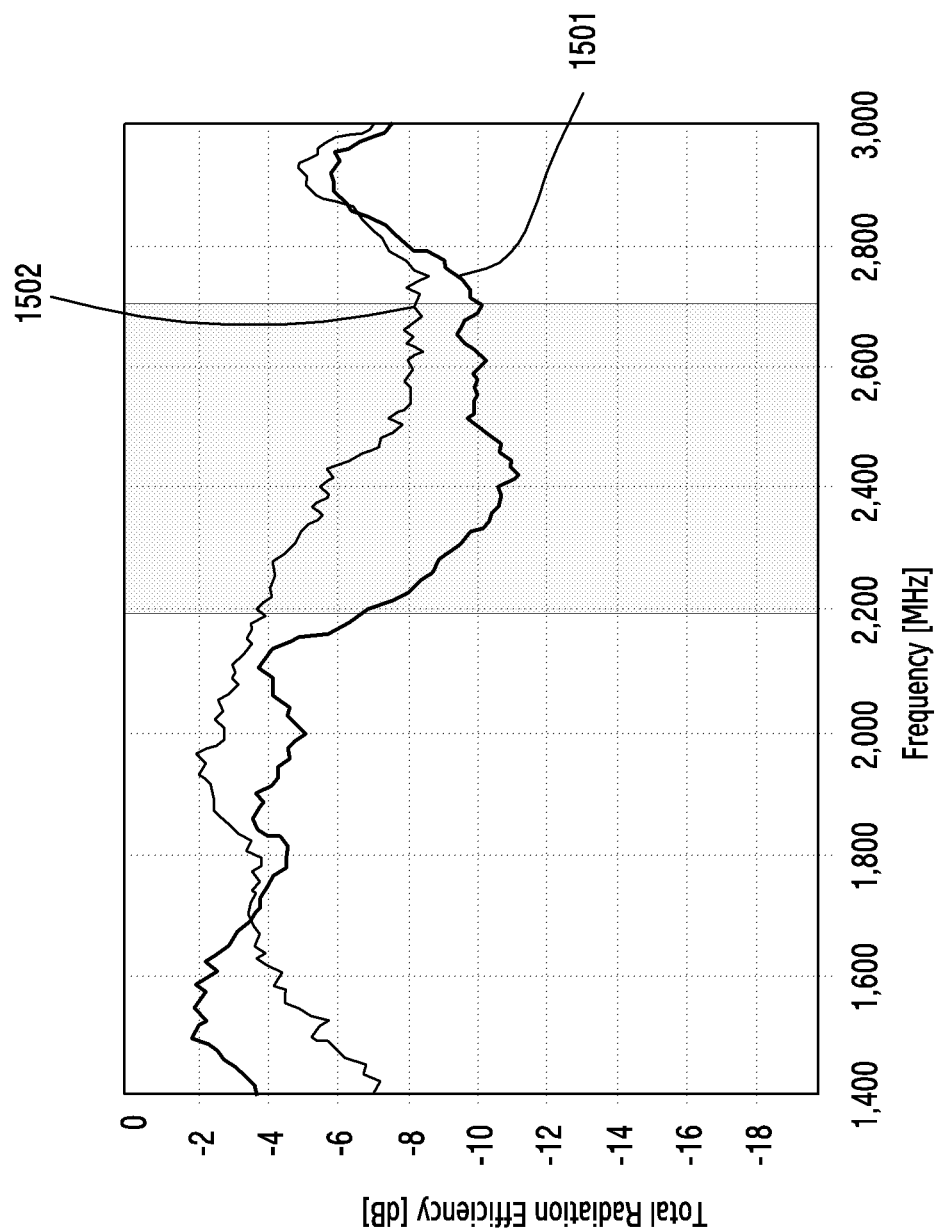

ANTENNA AND ELECTRONIC DEVICE INCLUDING SAME

CROSS-REFERENCE TO RELATED APPLICATION(S)

This application is a U.S. National Stage application under 35 U.S.C. § 371 of an International application number PCT/KR2019/017498, filed on Dec. 11, 2019, which is based on and claimed priority of a Korean patent application number 10-2018-0160098, filed on Dec. 12, 2018, in the Korean Intellectual Property Office, the disclosure of which is incorporated by reference herein in its entirety.

TECHNICAL FIELD

Various embodiments of the disclosure relate to an antenna and an electronic device including the same.

BACKGROUND ART

In line with development of electronic communication technologies, electronic devices having various functions have appeared. Such electronic devices may perform one or more functions in a combined manner (convergence function).

Recently, functional differences between electronic devices from respective manufacturers have been noticeably reduced, and electronic devices thus tend to have enhanced design aspects and to become slimmer in order to satisfy consumers' desire to buy.

DISCLOSURE OF INVENTION

Technical Problem

Electronic devices having at least two housings configured to rotatably operate by a connector in a rotatable type (for example, a foldable type, a slide type, or a swivel type) have appeared. For example, a rotatable-type electronic device may have at least two housings disposed so as to overlap each other, and, as a result of such operations, the radiation performance of an antenna disposed on one housing may be degraded by a metal member disposed in a corresponding position on the other housing that overlaps the same.

An embodiment of the disclosure may provide an antenna capable of preventing degradation of the antenna performance due to overlapping of housings, and an electronic device including the same.

Various embodiments of the disclosure may efficiently secure a space to accommodate at least one antenna, which needs to be provided for communication among components of an electronic device, and may simultaneously reduce radiation performance degradation.

Solution to Problem

According to an embodiment of the disclosure, an electronic device may include: a foldable housing including: a hinge structure including at least one first conductive portion; a first housing structure connected to the hinge structure, and including a first surface oriented in a first direction, a second surface oriented in a second direction that is opposite to the first direction, and a first side member surrounding at least a part of a space between the first surface and the second surface and including at least one second conductive portion; and a second housing structure connected to the hinge structure, and including a third surface oriented in a third direction, a fourth surface oriented in a fourth direction that is opposite to the third direction, and a second side member surrounding at least a part of a space between the third surface and the fourth surface, the second housing structure being foldable with respect to the first housing structure about the hinge structure; a foldable housing configured such that the first surface faces the third surface in a folded state of the foldable housing and the third direction is identical to the first direction in an unfolded state of the foldable housing; a flexible display extending from the first surface to the third surface; and a wireless communication circuit electrically connected to the first conductive portion in the folded state and electrically connected to the second conductive portion in the unfolded state, and configured to transmit and/or receive a signal having a selected frequency.

Advantageous Effects of Invention

According to various embodiments of the disclosure, at least one conductive portion included in a hinge structure or at least one second conductive portion included in a housing structure may be selectively used as an antenna, depending on the unfolded state or folded state of an electronic device, thereby securing antenna radiation performance with regard to the unfolded state or folded state of the electronic device.

Other advantageous effects obtainable or predictable from various embodiments of the disclosure will be disclosed explicitly or implicitly in the detailed description of embodiments of the disclosure. For example, various advantageous effects predictable according to various embodiments of the disclosure will be disclosed in the following detailed description.

BRIEF DESCRIPTION OF DRAWINGS

FIG. 14B illustrates a folded state of an electronic device according to an embodiment;

FIG. 15 is a graph depicting antenna radiation performance when at least one second conductive portion of a side member is utilized as an antenna in a state, in which an electronic device is unfolded or folded.

BEST MODE FOR CARRYING OUT THE INVENTION

Hereinafter, various embodiments of the disclosure will be described with reference to the accompanying drawings.

Figure 1:
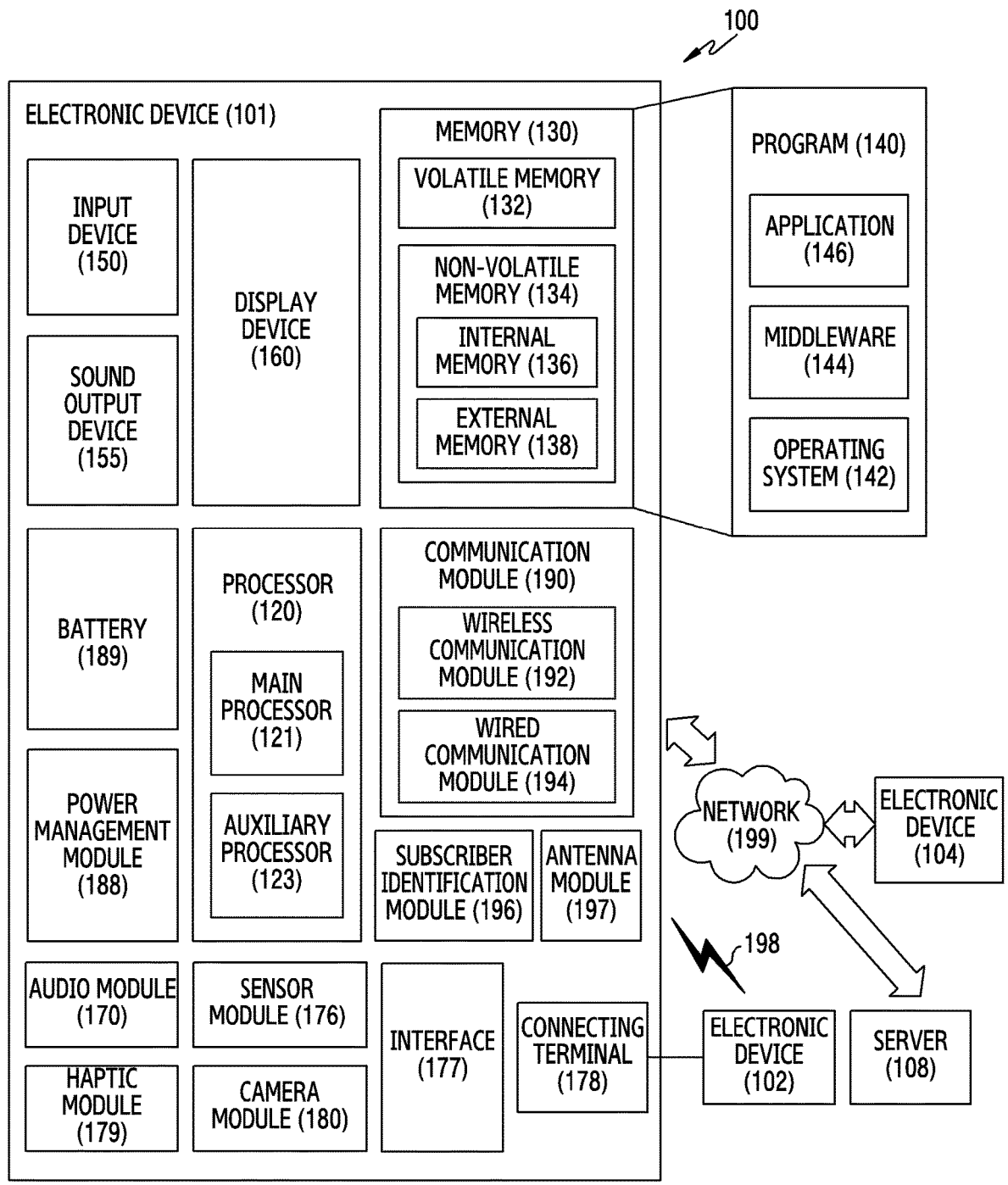
FIG. 1 is a block diagram of an electronic device in a network environment according to embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
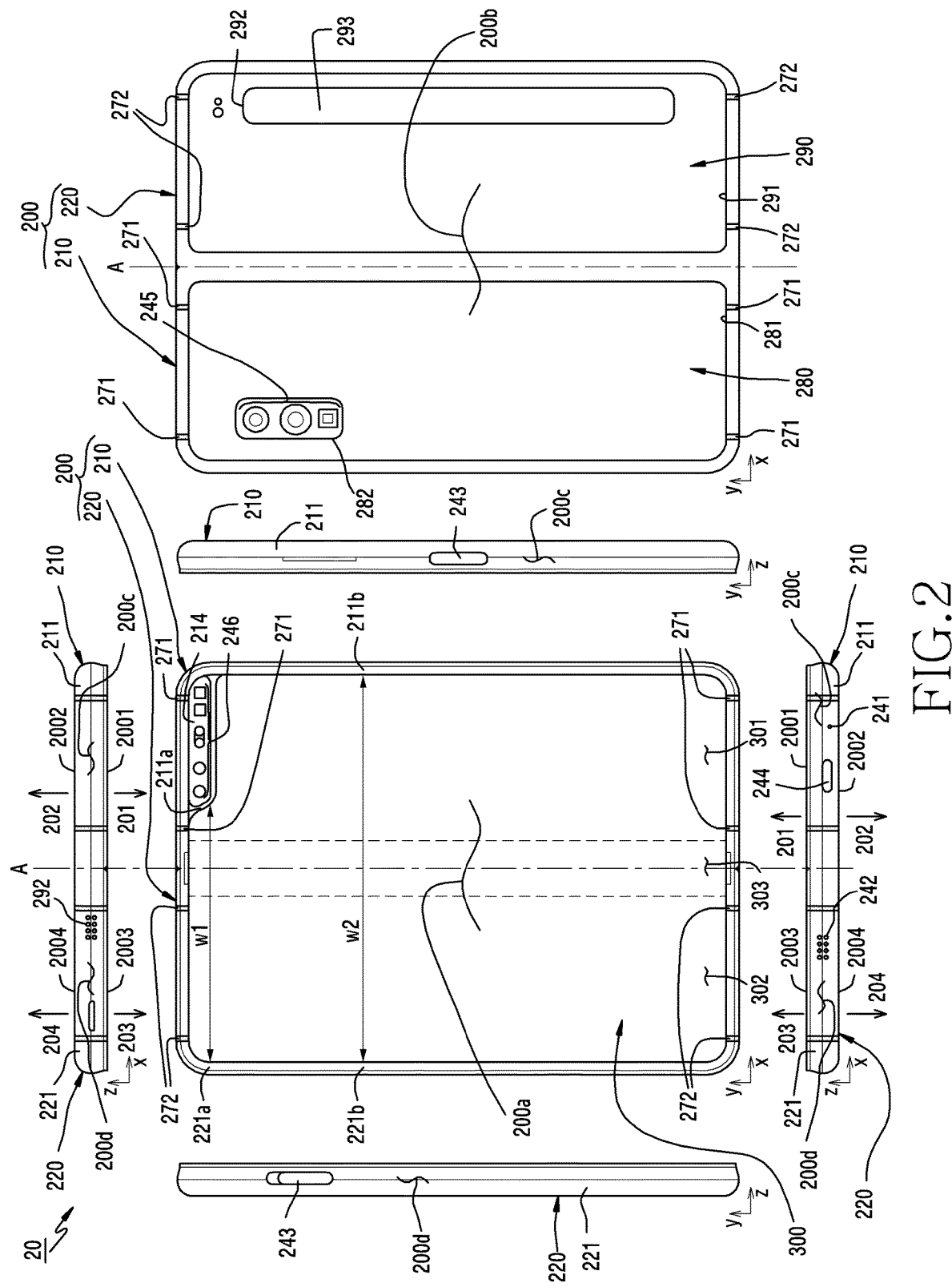
FIG. 2 is a view illustrating an unfolded state of an electronic device according to an embodiment.
Figure 3:
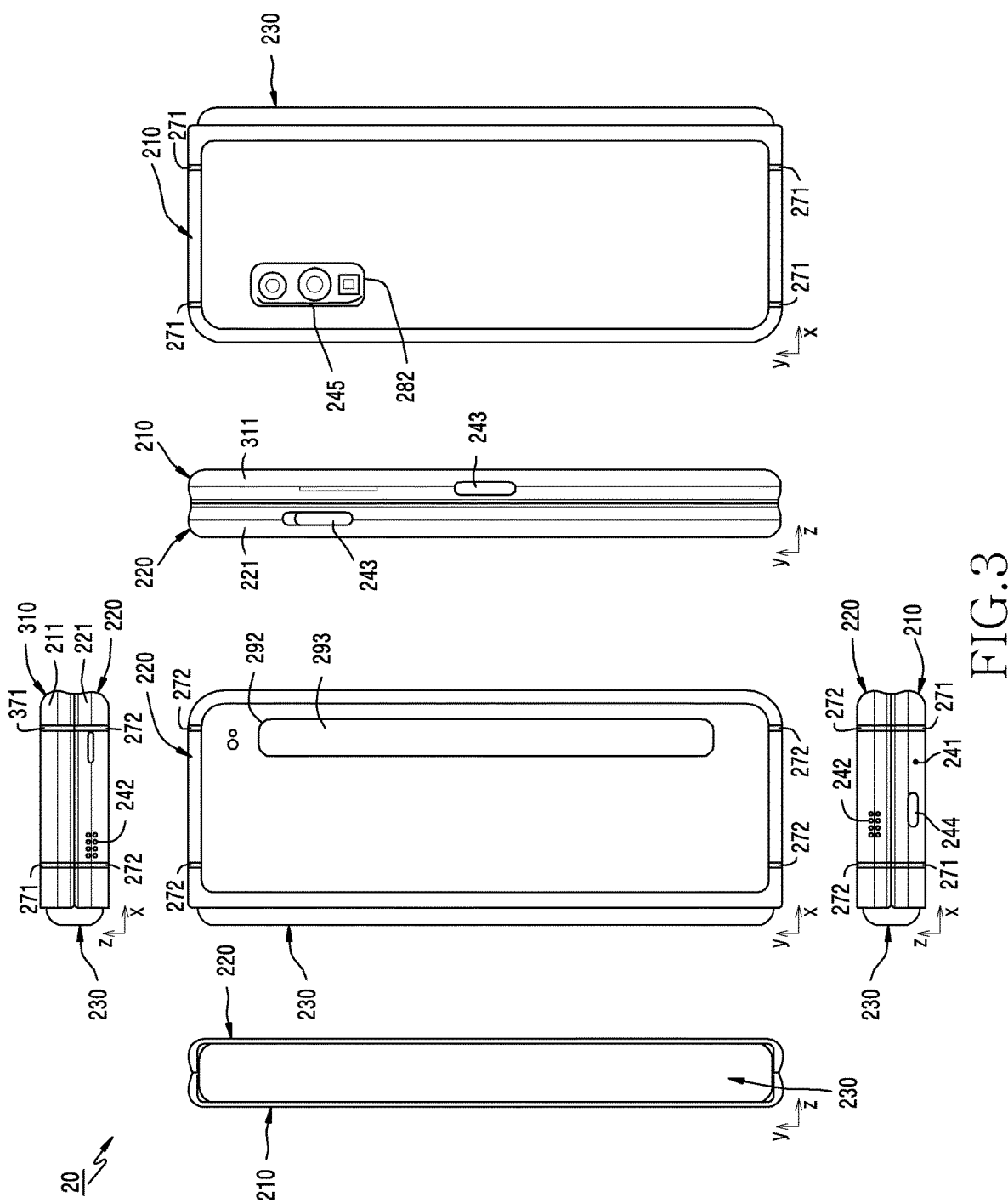
FIG. 3 is a view illustrating a folded state of an electronic device according to an embodiment.

FIG. 2 is a view illustrating an unfolded (or flat) state of an electronic device according to an embodiment. FIG. 3 is a view illustrating a folded state of an electronic device according to an embodiment.

Referring to FIGS. 2 and 3, in an embodiment, an electronic device 20 (e.g., the electronic device 101 of FIG. 1) may include a foldable housing 200, a hinge cover 230 that covers a foldable part of the foldable housing 200, and a flexible or foldable display 300 (hereinafter, briefly referred to as "a display" 300) (e.g., the display device 160 of FIG. 1) disposed in a space defined in the foldable housing 200. According to an embodiment, the foldable housing 200 may include a front surface 200a, through which the display 300 is exposed, a rear surface 200b oriented in a direction that is opposite to the front surface 200a, and side surfaces 200c and 200d that surround a space between the front surface 200a and the rear surface 200b.

According to an embodiment, the foldable housing 200 may include a first housing structure 210 and a second housing structure 220 that are connected to each other by a hinge structure (not illustrated). For example, the first housing structure 210 may be connected to the second housing structure 220 by the hinge structure to be rotatable.

According to an embodiment, the first housing structure 210 may include a first surface 2001 oriented in a first direction 201, a second surface 2002 oriented in a second direction 202 that is opposite to the first direction 201, and a first side surface 200c that surrounds at least a part of a space between the first surface 2001 and the second surface 2002. The second housing structure 220 may include a third surface 2003 oriented in a third direction 203, a fourth surface 2004 oriented in a fourth direction 204 that is opposite to the third direction 203, and a second side surface 200d that at least partially surrounds a space between the third surface 2003 and the fourth surface 2004. The front surface 200a of the electronic device 20 may include the first surface 2001 and the third surface 2003, and the rear surface 200b of the electronic device 20 may include the second surface 2002 and the fourth surface 2004. According to various embodiments (not illustrated), the first housing structure 210 may refer to a structure that defines a part of the first surface 2001, the second surface 2002, and the first side surface 200c. According to various embodiments (not illustrated), the second housing structure 220 may refer to a structure that defines a part of the third surface 2003, the fourth surface 2004, and the second side surface 200d.

According to an embodiment, the foldable housing 200 may include a transparent plate (not illustrated) (e.g., a polymer plate including various coating layers) that defines the first surface 2001 and the third surface 2003. The display 300 may be disposed along the transparent plate, and may be exposed through the first surface 2001 and the third surface 2003. The transparent plate may have flexibility that allows the electronic device 20 to be folded. According to an embodiment, the display 300 may be implemented to include the transparent plate, and the transparent plate may be omitted from the foldable housing 200.

According to an embodiment, the first housing structure 210 may include a first rear surface 280 that is disposed on one side of a folding axis A and defines at least a part of the second surface 2002. For example, the first rear cover 280 may have a periphery 281 that is substantially rectangular, and the periphery 281 may be surrounded by a first side member 211. According to various embodiments, the first side member 211 and the first rear cover 280 may be integrally formed and may include the same material.

According to an embodiment, the second housing structure 220 may include a second rear surface 290 that is disposed on another side of the folding axis A and defines at least a part of the fourth surface 2004. For example, the second rear cover 290 may have a periphery 291 that is substantially rectangular, and the periphery 291 may be surrounded by a second side member 221. According to various embodiments, the second side member 221 and the second rear cover 290 may be integrally formed and may include the same material.

According to various embodiments, the first rear cover 280 and/or the second rear cover 290, for example, may be formed of coated or colored glass, ceramics, a polymer, a metal (e.g., aluminum, stainless steel (STS), or magnesium), or a combination of at least two thereof.

According to an embodiment, the first rear cover 280 and the second rear cover 290 may have shapes that are substantially symmetrical to each other with respect to the folding axis A. However, the first rear cover 280 and the second rear cover 290 do not necessarily have mutually symmetrical shapes, and in another embodiment, a first rear cover 280 and/or a second rear cover 290 of other various shapes may be provided.

According to an embodiment, the first housing structure 210 may include the first side member (or the first side bezel structure) 211 that defines the first side surface 200*c*, and the second housing structure 220 may include the second side member (or the second side bezel structure) 221 that defines the second side surface 200*d*. The first side member 211 and/or the second side member 221 may include a metal or a polymer.

According to various embodiments, the first side member 211 and the second side member 221 may extend to form a peripheral area of the front surface 200*a*. For example, the front surface 200*a* of the electronic device 20 may be defined by the display 300, a partial area of the first side member 211 that is adjacent to the display 300, and a partial area of the second side member 221.

According to various embodiments, a partial area (not illustrated) of the first side member 211, which is adjacent to the periphery 281 of the first rear cover 280, and/or a partial area (not illustrated) of the second side member 221, which is adjacent to the periphery 291 of the second rear cover 290, may define a part of the rear surface 200*b*. For example, the rear surface 200*b* of the electronic device 20 may be defined by the first rear cover 280, and a partial area of the first side member 211, which is adjacent to the first rear cover 280, the second rear cover 290, and a partial area of the second side member 221, which is adjacent to the second rear cover 290.

According to an embodiment, the first side member 211 and the second side member 221 may be disposed on opposite sides of a folding axis A, and may have a shape that is symmetrical to each other with respect to the folding axis A as a whole.

According to an embodiment, the first housing structure 210 may further include a component arrangement area 214 that extends from the first side member 211 or is coupled to the first side member 211 to define the first surface 2001 together with the display 300. An area of the first side member 221, excluding the component arrangement area 214, may have a shape that is symmetrical to the second side member 221. At least one component that utilizes the first surface 2001 may be arranged in the component arrangement area 214. According to an embodiment, the component arrangement area 214 may be formed to have an area that is configured to be adjacent to one corner of the first side member 211. According to various embodiments, the arrangement, the shape, and the size of the component area 214 are not limited to the illustrated examples. For example, in another embodiment, the component arrangement area 214 may be provided to another corner of the first side member 211 or an arbitrary area between an upper end corner and a lower end corner. Components for performing various functions equipped in the electronic device 20 may be exposed to the first surface 2001, through the component arrangement area 214 or one or more openings (not illustrated) provided in the component arrangement area 214. According to an embodiment, the components 246 arranged in the component arrangement area 214 may include at least one of various sensors, such as a proximity sensor, a front camera, a light emitting element, or a receiver. For example, the light emitting element may provide state information on the electronic device in the form of light. In another embodiment, the light emitting element, for example, may provide a light source that interworks with an operation of the front camera. The light emitting element, for example, may include an LED, an IR LED, and a xenon lamp.

According to an embodiment, the electronic device 20 may include one or more of audio modules 241 and 242, a key input device 243, or a connector hole 244.

According to an embodiment, the audio modules 241 and 242 may include a microphone hole 241 and a speaker hole 242. A microphone for acquiring external sounds may be disposed in the microphone hole 241, and in some embodiments, a plurality of microphones may be disposed to detect the direction of a sound. The speaker hole 242 may include an external speaker hole and a communication receiver hole. In some embodiments, the speaker hole 242 and the microphone hole 241 may be realized by one hole or a speaker may be included while the speaker hole 242 is not employed (e.g., a piezoelectric speaker).

According to an embodiment, a key input device 243 may be disposed on a side surface 200*c* and 200*d* of the folder housing 200. In another embodiment, the electronic device 20 may not include some or all of the above-mentioned key input devices 243 and the key input devices 243 which are not included, may be realized in different forms, such as a soft key, on the display 300. In some embodiments, the key input device may include a sensor module (e.g., one or more components 245 arranged in a first rear area 282) disposed in a second surface 2002 of the first housing structure 210.

According to an embodiment, the connector hole 244 may include a first connector hole that may receive a connector (e.g., a USB connector) for transmitting and receiving electric power and/or data to and from an external electronic device, and/or a second connector hole (e.g., an earphone jack) 109 that may receive a connector for transmitting and receiving an audio signal to and from the external electronic device. The locations or the number of the connector holes are not limited to those of the example illustrated in FIG. 3, and may be differently designed.

In another embodiment (not illustrated), at least one of the audio module (e.g., the receiver for communication), the sensor module (e.g., the proximity sensor or the fingerprint sensor), the camera module (e.g., the front camera), or the light emitting element may be included on the rear surface of the screen display area of the display 300. In another embodiment (not illustrated), the display 300 may be coupled to or be disposed to be adjacent to a touch detection circuit, a pressure sensor that may measure the strength (the pressure) of a touch, and/or a digitizer that detects a stylus pen of a magnetic field type.

In an embodiment, the first housing structure 210 and the second housing structure 220 may be arranged together with a recess that is a space, in which the display 300 is disposed. In the illustrated embodiment, due to the component arrangement area 214, the recesses may have two different widths in a direction that is perpendicular to the folding axis A.

For example, the recess may have a first width w1 between a first portion 221*a* of the second side member 221, which is parallel to the folding axis A, and a first portion 211*a* of the first side member 211, which is disposed at a periphery of the component arrangement area 214. The recess may include a second width w2 between a second portion 221*b* of the second side member 221, and a second portion 211*b* of the first side member 211, which is parallel to the folding axis A while not corresponding to the component arrangement area 214. The second width w2 may be disposed to be longer than the first width w1. According to an embodiment, the first portion 211*a* of the first housing structure 210 and the first portion 221*a* of the second housing structure 220, which have asymmetrical shapes, may define the first width w1 of the recess, and the second portion 211*b* of the first housing structure 210 and the second portion 221*b* of the second housing structure 220, which have symmetrical shapes, may define the second width w2 of the recess. According to an embodiment, the distances of the first portion 221*a* and the second portion 221*b* of the second housing structure 220 from the folding axis A may be different. The widths of the recess are not limited to the illustrated examples. According to various embodiments, the recess may have a plurality of widths due to the form of the component arrangement area 214 or the portions of the first housing structure 210 and the second housing structure 220, which have asymmetrical shapes.

According to various embodiments, one or more components may be disposed on the rear surface 200*b* of the electronic device 200 or may be visually exposed. For example, at least a part of a sub-display 293 may be visually exposed through the second rear area 292 of the second rear cover 290. For example, one or more components may be visually exposed through the first rear area 282 of the first rear cover 280. In various embodiments, the one or more components 245 may include a sensor (e.g., the proximity sensor or a heart rate sensor) and/or the rear camera.

Referring to FIG. 3, the hinge cover 230 may be disposed between the first housing structure 210 and the second housing structure 220 and may cover internal components (e.g., the hinge structure). According to some embodiments, the hinge structure may be referred to as an element including the hinge cover 230. In an embodiment, the hinge cover 230 may be covered by a portion of the first housing structure 210 and the second housing structure 220 or be exposed to the outside according to the state (e.g., the unfolded state or the folded state) of the electronic device 20.

For example, as illustrated in FIG. 2, when the electronic device 20 is in the unfolded state, the hinge cover 230 may not be exposed while being covered by the first housing structure 210 and the second housing structure 220. For example, as illustrated in FIG. 3, when the electronic device 20 is in the folded state (e.g., a fully folded state), the hinge cover 230 may be exposed between the first housing structure 210 and the second housing structure 220. For example, when the electronic device 20 is in an intermediate state, in which the first housing structure 210 and the second housing structure 220 are folded with a certain angle (e.g., a state between the unfolded state and the folded state), the hinge cover 230 may be exposed to the outside between the first housing structure 210 and the second housing structure 220. The exposed area of the hinge cover 230 in the intermediate state may be smaller than the exposed area of the hinge cover 230 in the fully folded state. In an embodiment, the hinge cover 230 may include a curved surface, and the curved surface may define one side surface of the electronic device 20 in the folded state.

According to various embodiments, the display 300 may refer to a display, at least a part of which may be deformed to a flat surface or a curved surface. In an embodiment, referring to FIG. 2, the display 300 may include a folding area 301, a first area 301 disposed on one side (e.g., the right side of the folding area 303) of the folding area 303, and a second area 302 disposed on an opposite side thereof (the left side of the folding area 303).

According to various embodiments, the classification of the areas of the display 300 illustrated in FIG. 2 is illustrative, and the display 300 may be classified into a plurality of areas (e.g., four or more areas or two areas) according to the structure or function of the display 300. For example, although the areas of the display 300 are classified by the folding area 303 or the folding axis A extending in parallel to the y axis in the embodiment illustrated in FIG. 2, the areas of the display 300 may be classified with reference to another folding area (e.g., a folding area that is parallel to the x axis) or another folding axis (e.g., a folding axis that is parallel to the x axis) in another embodiment.

According to an embodiment, the first area 301 and the second area 302 of the display 300 may have shapes that are symmetrical to each other with respect to the folding area 303 as a whole. According to an embodiment, the second area 302, unlike the first area 301, may include a notch that is cut due to presence of the component arrangement area 214, but may have a shape that is symmetrical to the first area 301 with respect to the folding area 303 in other areas. For example, the first area 301 and the second area 302 may include parts that have shapes that are symmetrical to each other with respect to the folding area 303, and parts that have asymmetrical shapes.

According to an embodiment, the angle or the distance between the first housing structure 210 and the second housing structure 220 may vary according to the unfolded state, the folded state, or the intermediate state of the foldable housing 200. Hereinafter, the operations of the first housing structure 210 and the second housing structure 220 and the areas of the display 300 according to the states (e.g., the unfolded state and the folded state) of the electronic device 20 will be described.

According to an embodiment, when the electronic device 20 is in the unfolded state (see FIG. 2), the first direction 201, in which the first surface 2001 of the first housing structure 210 is oriented, and the third direction 230, in which the third surface 2003 of the second housing 220 is oriented, may be identical. For example, in the unfolded state, the first surface 2001 of the first housing structure 210 and the third surface 2003 of the second housing structure 220 may be arranged to be oriented in the identical direction (the direction, in which the front surface 200a of the electronic device 20 is oriented) while defining about 180 degrees. In the state, in which the electronic device 20 is unfolded, the surface of the first area 301 and the surface of the second area 302 of the display 300 may be oriented in the same direction (e.g., a direction, in which the front surface 200a of the electronic device 20 is oriented) while defining an angle of about 180 degrees. The folding area 303 of the display 300 may be disposed on a plane that is identical to those of the first area 301 and the second area 302.

In an embodiment, when the electronic device 20 is in the folded state (see FIG. 3), the first housing structure 210 and the second housing structure 220 may be arranged to face each other. For example, in the folded state, the first surface 2001 of the first housing structure 210 and the third surface 2003 of the second housing structure 220 may face each other. In the folded state, the surface of the first area 301 and the surface of the second area 302 of the display 300 may face each other while defining a small angle (e.g., 0 degrees to 10 degrees). In the folded state, the folding area 303 may have a curved surface, at least a part of which has a certain curvature In an embodiment, when the electronic device 20 is in the intermediate state (e.g., the state between the unfolded state and the folded state), the first housing structure 210 and the second housing structure 220 may be arranged at a certain angle. In the intermediate state, the first surface 2001 of the first housing structure 210 and the third surface 2003 of the second housing structure 220 or the surface of the first area 301 and the surface of the second area 302 of the display 300 may define an angle that is larger than in the folded state and smaller than in the unfolded state. In the intermediate state, the folding area 303 may have a curved surface, at least a part of which has a certain curvature, and then the curvature may be smaller than in the folded state.

According to an embodiment, the first side member 211 may include a plurality of second conductive portions (not illustrated) that are physically or electrically separated from each other. Nonconductive members 271 may be arranged between the plurality of second conductive portions. According to an embodiment, the nonconductive members 271 may be those extending from a nonconductive first internal structure (not illustrated) disposed in the interior of the first housing structure 210. The first internal structure is coupled to the first side member 211, and accordingly, the plurality of second conductive portions may be maintained in a state in which they are physically separated from each other by the first internal structure. For example, the first internal structure may be formed through insert injection-molding in a form in which the first internal structure is coupled to the first side member 211.

According to an embodiment, the second side member 221 may include a plurality of third conductive portions (not illustrated) that are physically or electrically separated from each other. Nonconductive members 272 may be arranged between the plurality of third conductive portions. According to an embodiment, the nonconductive members 272 may be those extending from a nonconductive second internal structure (not illustrated) disposed in the interior of the second housing structure 220. The second internal structure is coupled to the second side member 221, and accordingly, the plurality of third conductive portions may be maintained in a state in which they are physically separated from each other by the second internal structure. For example, the second internal structure may be formed through insert injection-molding in a form in which the second internal structure is coupled to the second side member 221.

According to an embodiment, at least one of the second conductive portions of the first side member 221 may be electrically connected to a wireless communication circuit (e.g., the wireless communication module 192 of FIG. 1) and may be utilized as an antenna (or an antenna radiator).

Referring to FIG. 3, the second side member 221 and the first side member 211 are adjacent to each other when the electronic device 20 is in the folded state, and a wireless communication that utilizes at least one of the second conductive portions as an antenna may be electrically influenced by the second side member 221. For example, in the folded state, the second side member 221 may deteriorate the performance (e.g., antenna radiation performance) of the wireless communication that utilizes at least one of the second conductive portions as an antenna. For example, electromagnetic energy (or electromagnetic fields) radiated from at least one of the second conductive portions, which is utilized as an antenna, may be hindered by the second side member 221. According to an embodiment, in order to reduce the electrical influences, the nonconductive members 271 of the first side member 211 and the nonconductive members 272 of the second side member 221 may be designed to be aligned with each other in the folded state.

Referring to FIG. 3, the nonconductive members 271 of the first side member 211 and the nonconductive members 272 of the second side member 221 may be aligned with each other in the folded state, thereby improving the antenna radiation performance, but it may be difficult to secure the antenna radiation performance of a set value or more due to the electromagnetic coupling of the second conductive portion and the third conductive portion, which are adjacent to each other. For example, a capacitance may be caused between the second conductive portion and the third conductive portion by the electromagnetic coupling in the folded state, and the electromagnetic wave energy (or electromagnetic fields) emitted from the second conductive portion utilized as an antenna may be induced in the third conductive portion. Due to the induced electromagnetic wave energy, a reverse current that is different from a forward current flowing through the second conducive portion may be caused, and accordingly, the antenna radiation performance of the wireless communication that utilizes at least one of the second conducive portions as an antenna may deteriorate. According to an embodiment, based on the folded state or the unfolded state, at least one conductive portion that may secure antenna radiation performance may be selectively electrically connected to the wireless communication circuit (e.g., the wireless communication module 192 of FIG. 1).

According to an embodiment, the hinge structure (e.g., the hinge cover 230) may include at least one first conductive portion. According to an embodiment, when the electronic device 20 is in the folded state, the wireless communication circuit (e.g., the wireless communication module 192 of FIG. 1) may be electrically connected to at least one of the second conductive portions of the first side member 211 and at least one of the first conductive portions of the hinge structure (e.g., the hinge cover 230), and may transmit or receive a signal having a selected (or designated) frequency by using the at least one first conductive portion as an antenna. For example, referring to FIG. 3, when the electronic device 20 is in the folded state, the at least one first conductive portion of the hinge structure (e.g., the hinge cover 230) may not be covered by the first side member 211 and the second side member 221, and thus may be utilized as an antenna in the folded state of the electronic device 20.

According to an embodiment, when the electronic device 20 is in the unfolded state, the wireless communication circuit may be electrically connected to at least one of the second conductive portions of the first side member 211, and may transmit or receive a signal having the selected frequency by utilizing at least one of the second conductive portions as an antenna. According to an embodiment, when the electronic device 20 is in the unfolded state, the at least one first conductive portion of the hinge structure (e.g., the hinge cover 230) may not be electrically connected to the wireless communication circuit.

According to an embodiment, the at least one first conductive portion of the hinge structure (e.g., the hinge cover 230) may be or may not be electrically connected to the wireless communication circuit through a scheme of controlling at least one switch disposed between the at least one first conductive portion and the wireless communication circuit (e.g., the wireless communication module 192 of FIG. 1) when the electronic device 20 is in the folded state or unfolded state.

According to various embodiments, when the electronic device 20 is in the folded state, a first contact (not illustrated) disposed on at least one first conductive portion of the hinge structure (e.g., the hinge cover 230) or electrically connected thereto may physically contact the wireless communication circuit (e.g., the wireless communication module 192 of FIG. 1) or a second contact (not illustrated) electrically connected thereto. When the first contact and the second contact physically contact each other, the at least one first conductive portion of the hinge structure and the wireless communication circuit may be electrically connected to each other. When the electronic device 20 is in the unfolded state, the first contact and the second contact may be physically separated from each other. When the first contact and the second contact are physically separated from each other, the at least one first conductive portion of the hinge structure and the wireless communication circuit may not be electrically connected to each other.

According to an embodiment, at least one of the second conductive portions of the first side member 211 may be or may not be electrically connected to the wireless communication circuit (e.g., the wireless communication module 192 of FIG. 1) through a scheme of controlling at least one switch between at least one of the second conductive portions and the wireless communication circuit when the electronic device 20 is in the folded state or the unfolded state.

According to an embodiment, the electronic device 20 may detect the unfolded state or the folded state by utilizing at least one sensor. Other various devices or methods may be utilized to detect the unfolded state or the folded state of the electronic device 20.

Figure 4:
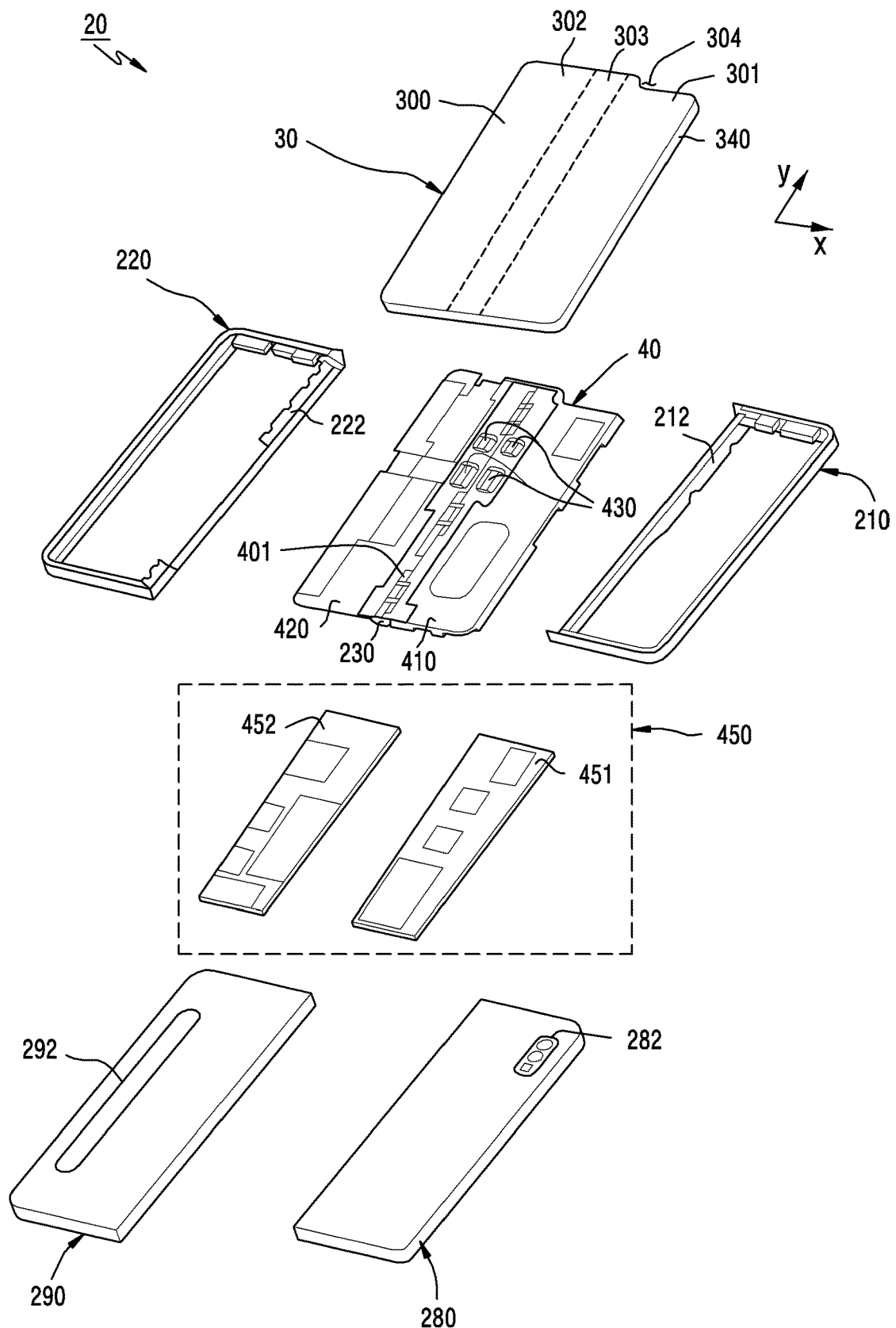
FIG. 4 is an exploded perspective view of the electronic device of FIG. 2 or 3.

FIG. 4 is an exploded perspective view of the electronic device 20 of FIG. 2 or 3.

Referring to FIG. 4, in an embodiment, the electronic device 20 may include at least one of a display unit 30, a support member assembly 40, a board part 450, a first housing structure 210, a second housing structure 220, a first rear cover 280, or a second rear cover 290. In the disclosure, the display unit 30 may be referred to as a display module or a display assembly.

The display unit 30, for example, may include a display 300, and one or more plates or layers 340, on which the display 300 is seated. In an embodiment, the plate 340 may be disposed between the display 300 and the support member assembly 40. The display 300 may be disposed in at least a part of one surface (e.g., an upper surface with reference to FIG. 4) of the plate 340. The plate 340 may have a shape corresponding to the display 300. For example, a partial area of the plate 340 may have a shape corresponding to a notch area 304 of the display 300.

According to an embodiment, the support member assembly 40 may include a first support member 410, a second support member 420, a hinge structure 401 disposed between the first support member 410 and the second support member 420, a hinge cover 230 that covers the hinge structure 401 when viewed from the outside, and a wiring member 430 (e.g., a flexible printed circuit (FPC)) that crosses the first support member 410 and the second support member 420.

In an embodiment, the support member assembly 40 may be disposed between the plate 340 and the board part 450. For example, the first support member 410 may be disposed between the first area 301 of the display 300 and a first board (e.g., a first printed circuit board) 451. The second support member 420 may be disposed between the second area 302 of the display 300 and a second board (e.g., a second printed circuit board) 452.

According to an embodiment, at least a part of the wiring member 430 and the hinge structure 401 may be disposed in the interior of the support member assembly 40. The wiring member 430 may be disposed in a direction (e.g., the x axis direction) that crosses the first support member 410 and the second support member 420. The wiring member 430 may be disposed in a direction (e.g., the x axis direction) that is perpendicular to the folding axis (e.g., the y axis or the folding axis A of FIG. 2) of the folding area 303 of the display 300.

According to an embodiment, the board part 450 may include a first board 451 disposed in the first support member 410 and a second board 452 disposed in the second support member 420. The first board 451 and the second board 452 may be arranged in the interior of a space defined by the support member assembly 40, the first housing structure 210, the second housing structure 220, the first rear cover 280, and the second rear cover 290. Components for realizing various functions of the electronic device 20 may be mounted on the first board 451 and the second board 452.

According to an embodiment, the hinge structure 401 or the hinge cover 230 may include at least one first conductive portion. According to an embodiment, based on the folded state or the unfolded state, the electronic device 20 may selectively utilize at least one of the at least one first conductive portions or second conductive portions as an antenna for a communication mode that utilizes a corresponding frequency band. According to an embodiment, when the electronic device 20 is in the folded state, the wireless communication circuit (e.g., the wireless communication module 192 of FIG. 1) mounted on the first substrate 451 may be electrically connected to the at least one first conductive portion included in the hinge structure 401 or the hinge cover 230. According to an embodiment, when the electronic device 20 is in the unfolded state, the wireless communication circuit may be electrically connected to at least one of the second conductive portions included in the first side member. According to an embodiment, when the electronic device 20 is in the folded state, the wireless communication circuit may not be electrically connected to the at least one first conductive portion of the hinge structure 401 or the hinge cover 230.

According to an embodiment, the first housing structure 210 and the second housing structure 220 may be assembled to be coupled to opposite sides of the support member assembly 40 in a state, in which the display unit 30 is coupled to the support member assembly 40. According to various embodiments, the first housing structure 210 and the second housing structure 220 may be slid from opposite sides of the support member assembly 40 and may be coupled to the support member assembly 40.

In an embodiment, the first housing structure 210 may include a first rotation support surface 212, and the second housing structure 220 may include a second rotation support surface 222 corresponding to the first rotation support surface 212. The first rotation support surface 212 and the second rotation support surface 222 may include curved surfaces corresponding to the curved surface included in the hinge cover 230.

In an embodiment, when the electronic device 20 is in the unfolded state (see FIG. 2), the first rotation support surface 212 and the second rotation support surface 222 may cover the hinge cover 230, and the hinge cover 230 may not be or may be minimally exposed to the rear surface of the electronic device 20. When the electronic device 20 is in the folded state (see FIG. 3), the hinge cover 230 may be maximally exposed between the first rotation support surface 212 and the second rotation support surface 222. According to an embodiment, the hinge cover 230 may be electrically connected the wireless communication circuit (e.g., the wireless communication module 192 of FIG. 1) in the folded state of the electronic device 200, and may be utilized as an antenna for securing the antenna performance.

Figure 5:
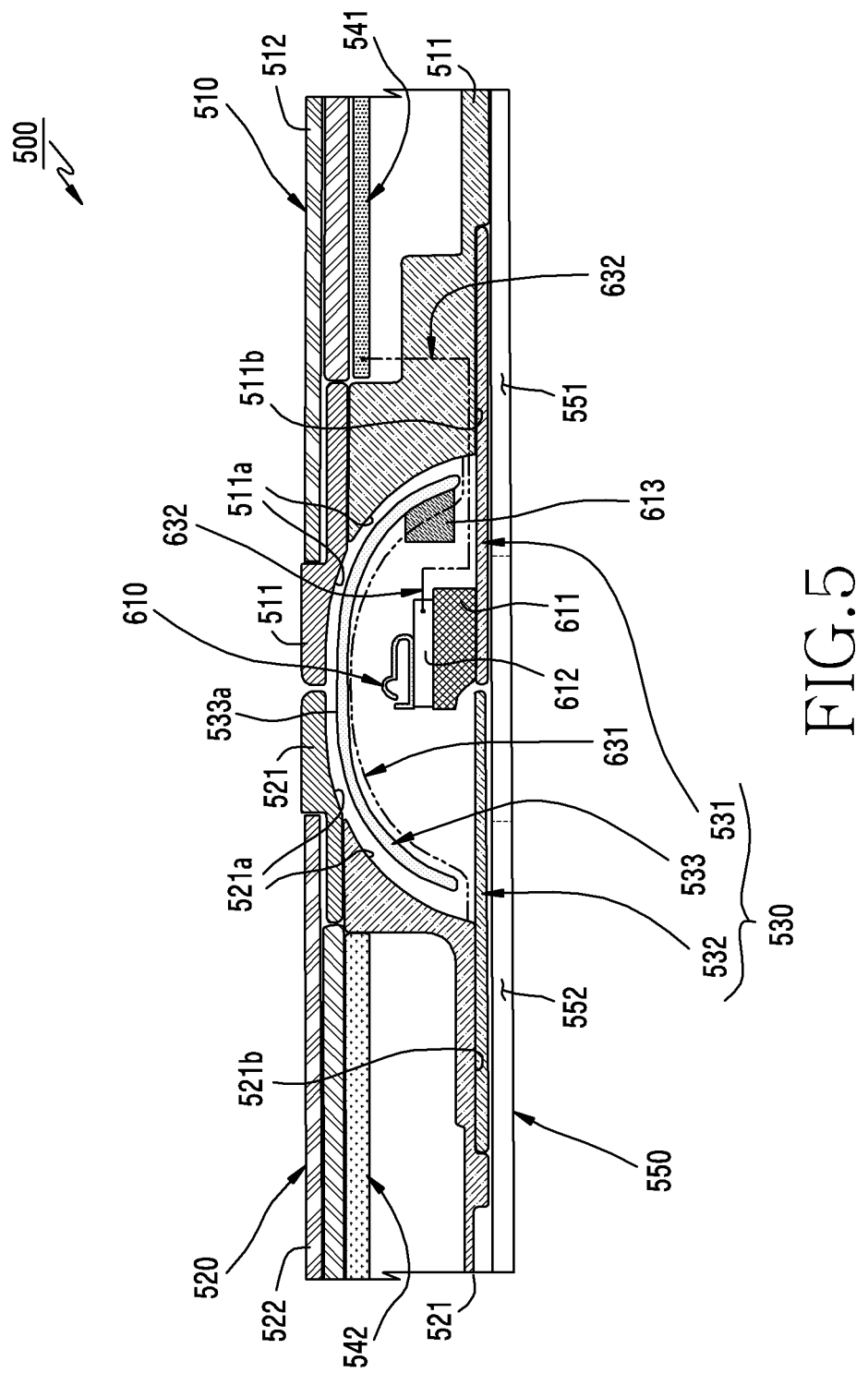
FIG. 5 is a cross-sectional view illustrating an unfolded state of an electronic device according to an embodiment.
Figure 6:
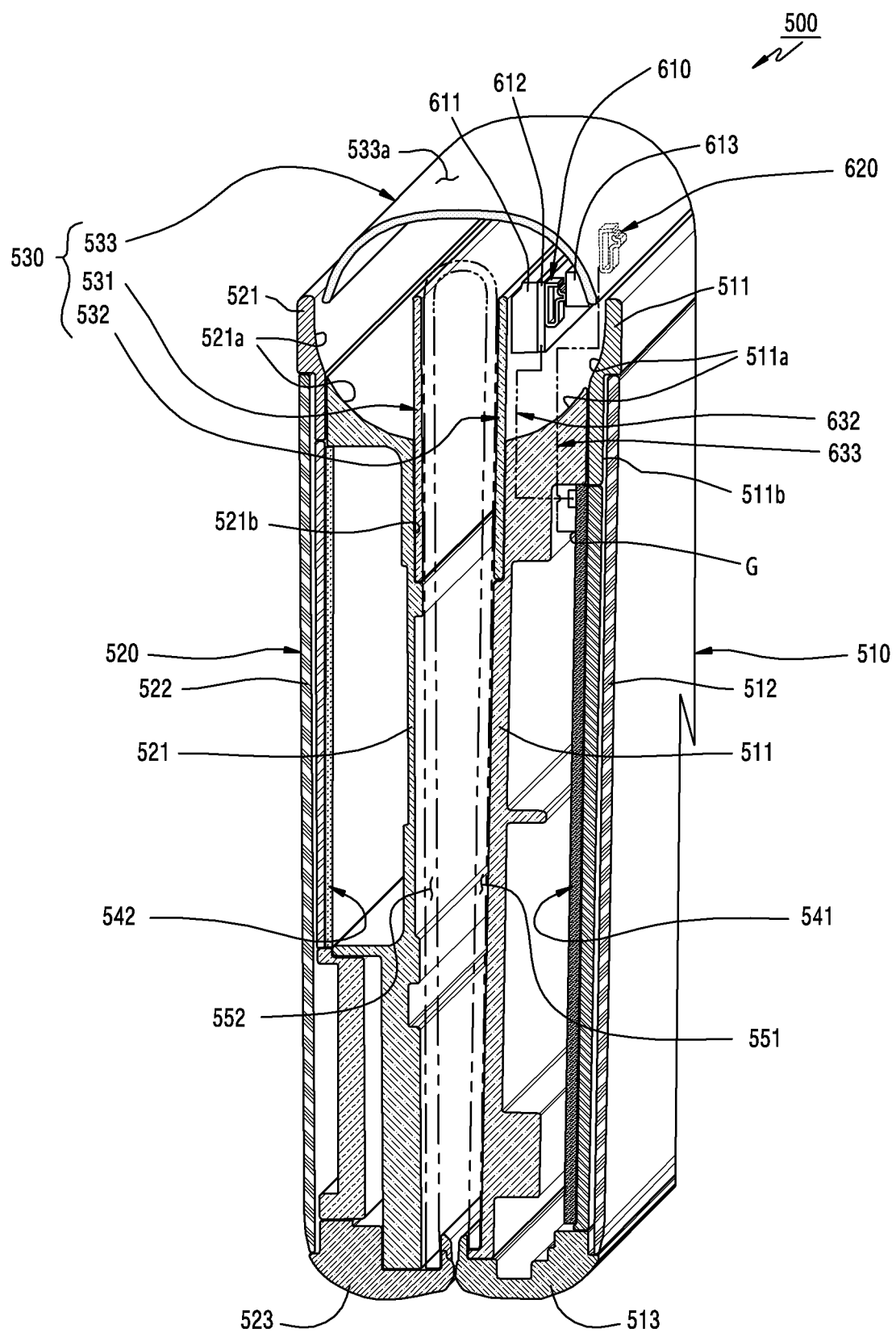
FIG. 6 is a cross-sectional view illustrating a folded state of an electronic device according to an embodiment.

FIG. 5 is a cross-sectional view illustrating an unfolded state of an electronic device according to an embodiment. FIG. 6 is a cross-sectional view illustrating a folded state of an electronic device according to an embodiment.

Referring to FIGS. 5 and 6, in an embodiment, an electronic device 500 (e.g., the electronic device 20 of FIG. 2) may include at least one of a first housing structure 510, a second housing structure 520, a hinge structure 530, a first printed circuit board 541, a second printed circuit board 542, a display 550, a first conductive member 610, a second conductive member 620, a first wiring member 631, a second wiring member 632, or a third wiring member 633.

According to an embodiment, the first housing structure 510 (e.g., the first housing structure 210 of FIG. 2) may include at least one of a first support member 511 (e.g., the first support member 410 of FIG. 4) and a first rear cover 512 (e.g., the first rear cover 280 of FIG. 2). For example, at least a part of the first support member 410 may be disposed between a first area 551 (e.g., the first area 301 of FIG. 2) of the display 550 (e.g., the display 300 of FIG. 2) and the first printed circuit board 541.

According to an embodiment, the second housing structure 520 (e.g., the second housing structure 220 of FIG. 2) may include a second support member 521 (e.g., the second support member 420 of FIG. 4) and a second rear cover 522 (e.g., the second rear cover 290 of FIG. 2). For example, at least a part of the second support member 521 may be disposed between a second area 552 (e.g., the second area 302 of FIG. 2) of the display 550 (e.g., the display 300 of FIG. 2) and the second printed circuit board 542. According to various embodiments, the electronic device 500 may include a support member (e.g., the plate 340 of FIG. 4), at least a part of which is disposed between the display 550 and the first support member 511 and the second support member 521. The support member may be coupled to the first support member 511 and the second support member 521 while supporting the display 550 which is flexible. According to some embodiments, the display 550 may include the support member.

According to an embodiment, the first wiring member 631 (e.g., the wiring member 430 of FIG. 4) may electrically connect the first printed circuit board 541 and the second printed circuit board 542. The first printed circuit board 541 and the second printed circuit board 542 may exchange signals through the first wiring member 631. The first wiring member 631, for example, may include various electrical connection members, such as a cable (e.g., a coaxial cable) or a flexible printed circuit board (FPCB). According to an embodiment, the first wiring member 631 may be disposed in at least a part of the hinge structure 530 so as not to be exposed to the outside. According to various embodiments, at least a part of the first wiring member 631 may be disposed in a hinge that connects the first hinge plate 531 and the second hinge plate 532.

According to an embodiment, the hinge structure 530 (e.g., the hinge structure 401 of FIG. 4) may include at least one of a first hinge plate 531, a second hinge plate 532, or a hinge cover 533 (e.g., the hinge cover 230 of FIG. 4). The first hinge plate 531 and the second hinge plate 532 may be connected to each other by a hinge (not illustrated) to be rotatable. The first hinge plate 531 may be coupled to the first support member 511 of the first housing structure 510, and the second hinge plate 532 may be coupled to the second support member 521 of the second housing structure 520. The first hinge plate 531 and/or the second hinge plate 532 may be formed of a metallic material (e.g., stainless steel) or may be formed of a nonmetallic material.

According to an embodiment, the hinge cover 533 may be disposed between the first housing structure 510 and the second housing structure 520 and may cover internal components (e.g., the hinge structure and the first conductive member 610). In an embodiment, the hinge cover 533 may be covered by a portion of the first housing structure 510 and the second housing structure 520 or be exposed to the outside according to the state (e.g., the unfolded state or the folded state) of the electronic device 500.

According to an embodiment, the first support member 511 of the first housing structure 510 may include a first rotation support surface 511*a* (e.g., the first rotation support surface 212 of FIG. 4) and a first coupling support surface 511*b*. A partial area of the first hinge plate 531 may be disposed to face the first coupling support surface 511*b*, and may be coupled to the first coupling support surface 511*b*. The first rotation support surface 511*a* may be disposed such that a space is present between the first rotation support surface 511*a* and the first hinge plate 531, while facing another partial area of the first hinge plate 531.

According to an embodiment, the second support member 521 of the second housing structure 520 may include a second rotation support surface 521*a* (e.g., the second rotation support surface 222 of FIG. 4) and a second coupling support surface 521*b*. A partial area of the second hinge plate 532 may be disposed to face the second coupling support surface 521*b*, and may be coupled to the second coupling support surface 521*b*. The second rotation support surface 521*a* may be disposed such that a space is present between the second rotation support surface 521*a* and the second hinge plate 532, while facing another partial area of the second hinge plate 532.

According to an embodiment, when the electronic device 500 is in the unfolded state (see FIG. 5), the first rotation support surface 511a and the second rotation support surface 521a may cover the hinge cover 533, and the hinge cover 533 may not be or may be minimally exposed to the outside. When the electronic device 500 is in the folded state (see FIG. 6), the hinge cover 533 may be exposed between the first rotation support surface 511a and the second rotation support surface 521a.

According to an embodiment, when the electronic device 500 is in the unfolded state (see FIG. 5), the hinge cover 533 may include a curved surface 533a, a least a part of which faces the first rotation support surface 511a and the second rotation support surface 521a. According to an embodiment, the first rotation support surface 511a and/or the second rotation support surface 521a may include a curved surface (not illustrated) corresponding to the curved surface 533a of the hinge cover 533. When the electronic device 500 is in the folded state (see FIG. 6), at least a part of the curved surface 533a may define at least a part of one side surface of the electronic device 500. According to an embodiment, when viewed in cross-section, the hinge cover 533 may include a curved shape.

According to an embodiment, the hinge structure 530 may include at least one first conductive portion. For example, at least a part of the first hinge plate 531, the second hinge plate 532, or the hinge cover 533 may include a conductive material, and may be utilized as at least one first conductive portion.

According to an embodiment, when the electronic device 500 is in the folded state, the wireless communication circuit (e.g., the wireless communication module 192 of FIG. 1) disposed in the first printed circuit board 541 may be electrically connected to the at least one first conductive portion included in the hinge structure 530. When the electronic device 500 is in the unfolded state (see FIG. 5), the wireless communication circuit disposed in the first printed circuit board 541 may not be electrically connected to the at least one first conductive portion included in the hinge structure 530.

According to an embodiment, the first conductive member 510 may be disposed in the first hinge plate 531, and may be electrically connected to a wireless communication circuit (not illustrated) (e.g., the wireless communication module 192 of FIG. 1) disposed in the first printed circuit board 541 through the second wiring member 632. The second wiring member 632, for example, may include various electrical connection members, such as a cable (e.g., a coaxial cable) or a flexible printed circuit board (FPCB) (e.g., an FPCB type RF cable). According to some embodiments, the second wiring member 632 may refer to a circuit or a structure that electrically connects the first conductive member 610 and the wireless communication circuit. When the electronic device 500 is in the unfolded state (see FIG. 5), the first conductive member 610 and the hinge cover 533 may be physically separated from each other. When the electronic device 500 is in the folded state (see FIG. 6), a gap between the first conductive member 610 and the hinge cover 533 may be reduced, and the first conductive member 610 may physically contact the hinge cover 533. When the electronic device 500 is in the folded state, the wireless communication circuit may transmit or receive a signal having a selected (or designated) frequency by utilizing at least a part of the hinge cover 533 as an antenna.

According to various embodiments, the electronic device 500 may further include a third conductive member 613 coupled to an inner surface of the hinge cover 533. When the electronic device 500 is in the folded state (see FIG. 6), the first conductive member 610 may physically contact the third conductive member 613, and the first conductive member 610 may be electrically connected to the hinge cover 533 through the third conducive member 613.

According to an embodiment, the first conductive member 610 may include a flexible conductive member. For example, the flexible conductive member may include at least one of a C clip, a pogo pin, a spring, conductive poron, conductive rubber, or a conductive tape. When the electronic device 500 is in the folded state (see FIG. 6), the first conductive member 610 and the hinge cover 533 may elastically contact each other.

According to various embodiments, the electronic device 500 may include a support member 611 made of a metallic material or a nonmetallic material disposed between the first conductive member 610 and the first hinge plate 531. The support member 611 may be configured such that the first conductive member 610 is spaced apart from the first hinge plate 531 by a set distance. According to some embodiments, the support member 611 may be omitted.

According to various embodiments, the electronic device 500 may include a third printed circuit board 612 disposed between the first hinge plate 531 and the first conductive member 610. The first conductive member 610 may be disposed in the third printed circuit board 612 through a conductive adhesive material such as solder. The second wiring member 632 may electrically connect the first printed circuit board 541 and the third printed circuit board 612. According to various embodiments, one end of the second wiring member 632 may include a connector connected to a connector disposed in the first printed circuit board 541, and an opposite end of the second wiring member 632 may include a connector connected to a connector disposed in the third printed circuit board 612. According to some embodiments, one end of the second wiring member 632 may be connected to the first printed circuit board 541 by a conductive adhesive material (e.g., solder), or the other end of the second wiring member 632 may be connected to the third printed circuit board 541 by a conductive adhesive material. According to some embodiments, the third printed circuit board 612 may be omitted, and in this case, the second wiring member 632 may connect the first conductive member 610 and the first printed circuit board 541. For example, one end of the second wiring member 632 may be connected to the first conductive member 610 with a conductive material.

According to various embodiments, in replacement of the third printed circuit board 612, members of various forms disposed between the first conductive member 610 and the first hinge plate 531 may be utilized, and for example, such a member may be referred to as 'an interposer' or 'a connector'.

According to an embodiment, when the electronic device 500 is in the folded state (see FIG. 6), a ground G may be electrically connected to at least one first conductive portion included in the hinge structure 530. When the electronic device 500 is in the unfolded state (see FIG. 5), the ground G (e.g., the ground disposed in the first printed circuit board 541 may not be electrically connected to the at least one first conductive portion included in the hinge structure 530.

According to an embodiment, a wireless communication circuit (e.g., the wireless communication module 192 of FIG. 1) disposed in the first printed circuit board 541 may provide a current to at least one first conductive portion of the hinge structure 530 through a second wiring member 632, and a transmission line that transmit or receive wireless electromagnetic waves may be transmitted or received, may be formed while the current is delivered along the at least one first conductive portion and is introduced into the ground G through a third wiring member 633.

In an embodiment, referring to FIG. 6, the second conductive member 620 may be disposed in the first hinge plate 531, and may be electrically connected to the ground G (e.g., the ground disposed in the first printed circuit board 541) through the third wiring member 633. The third wiring member 633, for example, may include various elements, such as a cable (e.g., a coaxial cable) or a flexible printed circuit board (FPCB) (e.g., an FPCB type RF cable). According to various embodiments, the second wiring member 632 and the third wiring member 633 may be implemented with one FPCB. According to some embodiments, the third wiring member 633 may refer to a circuit or a structure that electrically connects the second conductive member 620 and the ground G.

According to an embodiment, the second conductive member 620 may be disposed in the first hinge plate 531, similarly to the scheme of disposing the first conductive member 610 in the first hinge plate 531 by utilizing the support member 611 and/or the third printed circuit board 612. According to various embodiments, the first member 611 and/or the third printed circuit board 612 may extend between the second conductive member 620 and the first hinge plate 531, and may be utilized in the disposition of the second conductive member 620.

According to an embodiment, when the electronic device 500 is in the unfolded state (see FIG. 5), the second conductive member 620 and the hinge cover 533 may be physically separated from each other. When the electronic device 500 is in the folded state (see FIG. 6), a gap between the second conductive member 620 and the hinge cover 533 may be reduced, and the second conductive member 620 may physically contact the hinge cover 533.

In an embodiment, referring to FIG. 6, the first housing structure 510 may include a first side member 513 (e.g., the first side member 211 of FIG. 2 or 3) that surrounds at least a part of the space between the first rear cover 512 and the first area 551 of the display 550. The second housing structure 520 may include a second side member 523 (e.g., the second side member 221 of FIG. 2 or 3) that surrounds at least a part of the space between the second rear cover 522 and the second area 552 of the display 550. When the electronic device 500 is in the folded state, the first side member 513 and the second side member 523 may define a part of a side surface of the electronic device 500, and the curved surface 533*a* of the hinge cover 533 may define a part of a side surface of the electronic device 500.

According to an embodiment, the first side member 513 may include at least one second conductive portion. For example, the first side member 513 may include a plurality of second conductive portions that are physically or electrically separated from each other. Nonconductive members (e.g., the nonconductive members 271 of FIG. 2 or 3) may be arranged between the second conductive portions. The second side member 523 may include a plurality of third conductive portions (not illustrated) that are physically or electrically separated from each other, and nonconductive members (e.g., the nonconductive members 272 of FIG. 2 or 3) may be arranged between the plurality of third conductive portions.

According to an embodiment, when the electronic device 500 is in the unfolded state (see FIG. 5), the at least one second conductive portion of the first side member 513 may be electrically connected to the wireless communication circuit (e.g., the wireless communication module 192 of FIG. 1) disposed in the first printed circuit board 541. When the electronic device 500 is in the folded state, the wireless communication circuit may transmit or receive a signal having a selected (or designated) frequency by utilizing at least a part of the second conductive portion as an antenna. When the electronic device 500 is in the folded state (see FIG. 6), the at least one second conductive portion of the first side member 513 may not be electrically connected to the wireless communication circuit.

Figure 7:
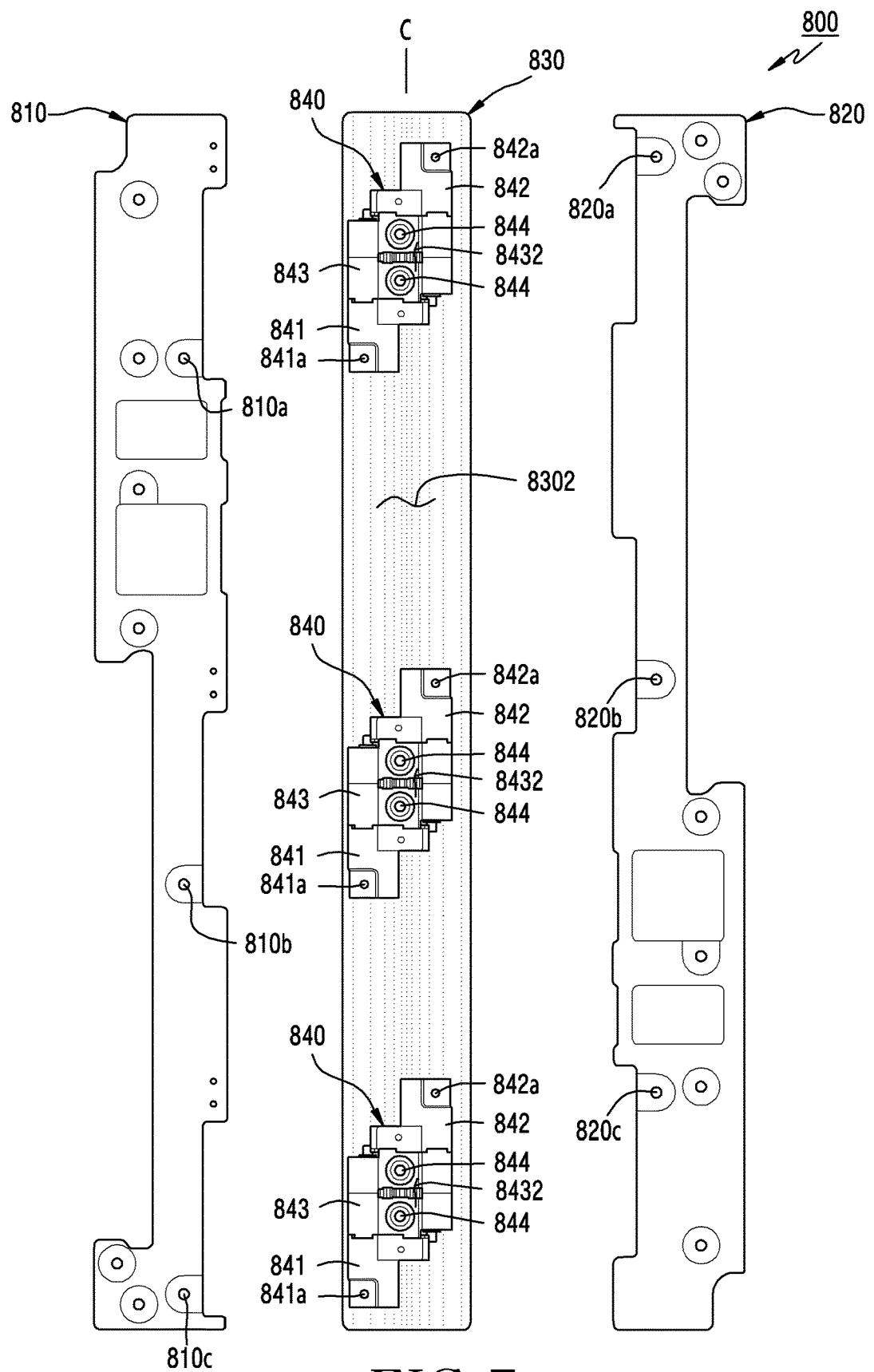
FIG. 7 is a perspective view of a disassembled state of a hinge structure according to an embodiment.
Figure 8:
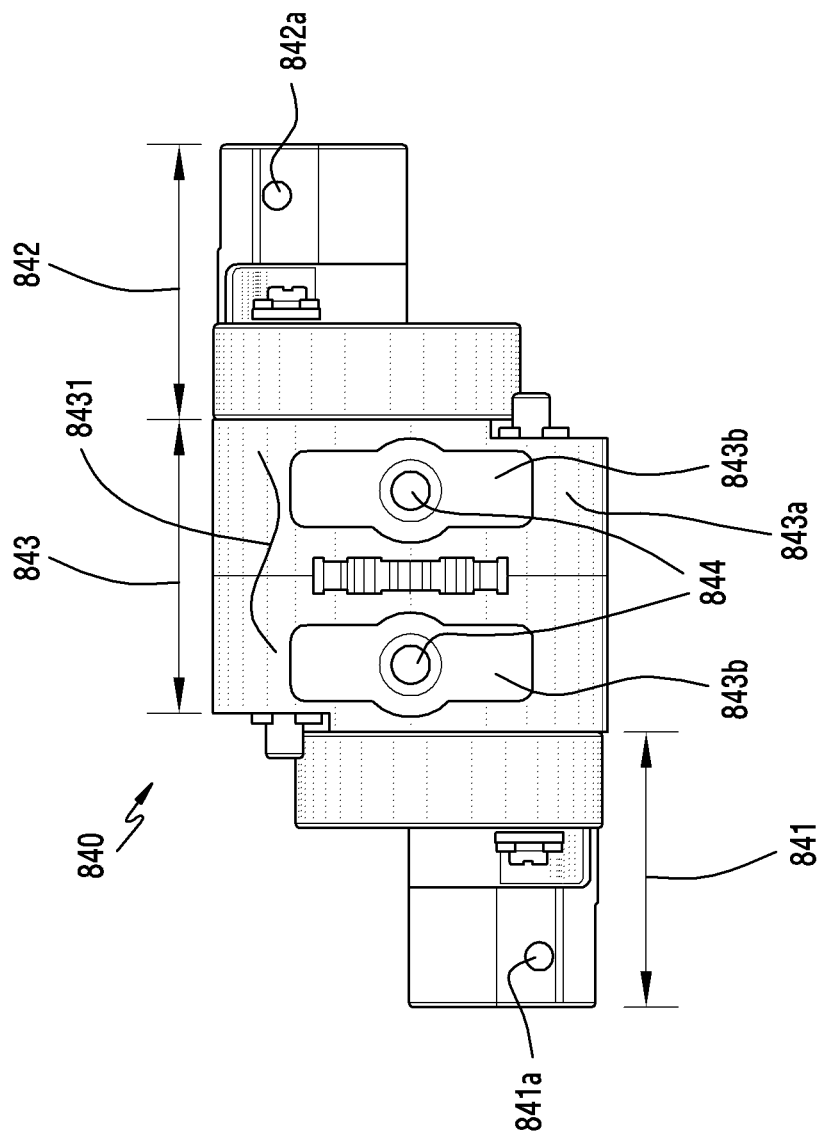
FIG. 8 is a rear view of a hinge according to an embodiment.

FIG. 7 is a perspective view of a disassembled state of a hinge structure according to an embodiment. FIG. 8 is a rear view of a hinge according to an embodiment.

Referring to FIG. 7, a hinge structure 800 (e.g., the hinge structure 401 of FIG. 4 or the hinge structure 530 of FIG. 5 or 6) may include at least one of a first hinge plate 810 (e.g., the first hinge plate 531 of FIG. 5 or 6), a second hinge plate 820 (e.g., the second hinge plate 532 of FIG. 5 or 6), a hinge cover 830 (e.g., the hinge cover 533 of FIG. 5 or 6), or at least one hinge 840.

According to an embodiment, the first hinge plate 810 and the second hinge plate 820 may be connected to each other by the at least one hinge 840 to be rotatable with respect to each other. Referring to FIGS. 7 and 8, in an embodiment, the hinge 840 may include a third part 843, a first part 841 connected to the third part 843 to be rotatable and coupled to the first hinge plate 810, and a second part 842 connected to the third part 843 to be rotatable and coupled to the second hinge plate 820. The first hinge plate 810 coupled to the first part 841 may be rotated about the third part 843 with respect to the second hinge plate 820 coupled to the second part 842.

According to an embodiment, the first part 841 of the hinge 840 and the first hinge plate 810 and/or the second part 842 of the hinge 840 and the second hinge plate 820 may be coupled to each other by a bolt (not illustrated). For example, the first hinge plate 810 may include a plurality of holes 810*a*, 810*b*, and 810*c* that are arranged in parallel to the center axis C of rotation between the first hinge plate 810 and the second hinge plate 820. The first part 841 of the hinge 840 may include a hole 841*a* that is aligned with the hole 810*a*, 810*b*, or 810*c* of the first hinge plate 810 and is coupled thereto by a bolt. For example, the second hinge plate 820 may include a plurality of holes 820*a*, 820*b*, and 820*c* arranged in parallel to the center axis C of rotation. The second part 842 of the hinge 840 may include a hole 842*a* that is aligned with the hole 820*a*, 820*b*, or 820*c* of the second hinge plate 820 and is coupled thereto by a bolt.

According to an embodiment, when the state of the first hinge plate 810 coupled to the first part 841 and the second hinge plate 820 coupled to the second part 842 is changed from a first state (e.g., the unfolded state), in which they define an angle of about 180 degrees, to a state, in which they define an angle that is smaller than a set angle (e.g., about 90 degrees), the state thereof may be automatically changed to a second state (e.g., the folded state), in which they define an angle of about 0 degrees to 10 degrees without any further external force. The state of the first hinge plate 810 coupled to the first part 841 and the second hinge plate 820 coupled to the second part 842 may automatically return to the first state when an external force applied thereto is released after it is changed from the first state (e.g., the unfolded state) to a state, in which they define an angle of a set angle (e.g., about 90 degrees) or more.

According to an embodiment, when the state of the first hinge plate 810 coupled to the first part 841 and the second hinge plate 820 coupled to the second part 842 is changed from the second state (e.g., the folded state), in which they define an angle of about 0 degrees to 10 degrees, to a state, in which they define an angle that is larger than the set angle (e.g., about 90 degrees), the state thereof may be automatically changed to the first state (e.g., the unfolded state), in which they define an angle of about 180 degrees without any further external force. The state of the first hinge plate 810 coupled to the first part 841 and the second hinge plate 820 coupled to the second part 842 may automatically return to the second state when an external force applied thereto is released after it is changed from the second state (e.g., the folded state) to a state, in which they define an angle of the set angle or less.

According to an embodiment, the hinge 840 may include an elastic structure (not illustrated) (e.g., a torsion spring) that allows the first part 841 and/or the second part 842 to be elastically rotated with respect to the third part 843. The elastic structure may allow an automatic change to the first state (e.g., the unfolded state) or the second state (e.g., the folded state) or an automatic return to the first state or the second state.

According to an embodiment, the third part 843 of the hinge 840 may include a first surface 8431 that faces an inner curved surface 8302 of the hinge cover 830 and a second surface 8432 disposed on an opposite side to the first surface 8431. According to an embodiment, the first surface 8431 may include a curved surface corresponding to the inner curved surface 8302 of the hinge cover 830, and the second surface 8432 may include a flat surface.

According to an embodiment, the third part 843 of the hinge 840 may be coupled to the hinge cover 830. For example, the third part 843 may include at least one hole 844 that passes between the first surface 8431 and the second surface 8432. The hinge cover 830 may include a hole or a recess (not illustrated) that is aligned with the at least one hole 844 of the third part 843 and is coupled thereto by a bolt.

According to an embodiment, the first part 841 of the hinge 840 may at least partially include a conductive material. According to an embodiment, the first hinge plate 810 may at least partially include a conductive material. The first part 841 and the first hinge plate 810 may be electrically connected to each other through the bolt that couples the first part 841 and the first hinge plate 810.

According to an embodiment, the second part 841 of the hinge 842 may at least partially include a conductive material. According to an embodiment, the second hinge plate 820 may at least partially include a conductive material. The second part 842 and the second hinge plate 820 may be electrically connected to each other through the bolt that couples the second part 842 and the second hinge plate 820.

According to an embodiment, the first hinge plate 810 and the second hinge plate 820 may be electrically connected to each other through the at least one hinge 840. For example, the third part 843 of the hinge 840 may at least partially include a conductive material. According to an embodiment, the third part 843 may include a first member 843a formed of a nonconductive material, and a second member 843b formed of a conductive material. The first member 843a may be a shell that defines an external appearance of the third part 843, and the second member 843b may at least partially covered by the first member 843a. According to an embodiment, the second member 843b may be at least a part of the structure that elastically rotates the first part 841 or the second part 842 with respect to the third part 843. According to an embodiment, the second member 843b may include an area exposed to the outside to define a part of the first surface 8431 together with the first member 843a. In an embodiment, the second member 843b may be electrically connected to the first part 841 and the second part 842. For example, the second member 843b of the third part 843 may physically contact and be electrically connected to the first part 841 and/or the second part 842. As another example, the hinge 840 may include a conductive member that electrically connects the second member 843b of the third part 843 and the first part 841, or the second member 843b of the third part 843 and the second part 842.

In some embodiments, the first hinge plate 810 and the second hinge plate 820 may not be electrically connected to each other.

According to an embodiment, the hinge cover 830 may at least partially include a conductive material, and may be electrically connected to the at least one hinge 840. For example, the at least one hole 844 for bolting to the hinge cover 830 may be disposed in an area that defines a part of the first surface 8431 of the second member 843b of the third part 843. Through the bolt that couples the second member 843b and the hinge cover 830, the second member 843b and the hinge cover 830 may be electrically connected to each other.

In some embodiments, the hinge cover 830 and the at least one hinge 840 may not be electrically connected to each other.

According to an embodiment, the hinge structure 800 may include a first hinge plate 810, a second hinge plate 820, and at least one first conductive portion that is referred to as at least a part of the second hinge plate 820. According to an embodiment, when the electronic device (e.g., the electronic device 200 of FIG. 2) including the hinge structure 800 is in the folded state (see FIG. 2), the electronic device may electrically connect the at least one first conductive portion to the wireless communication circuit (e.g., the wireless communication module 192 of FIG. 1).

Figure 9:
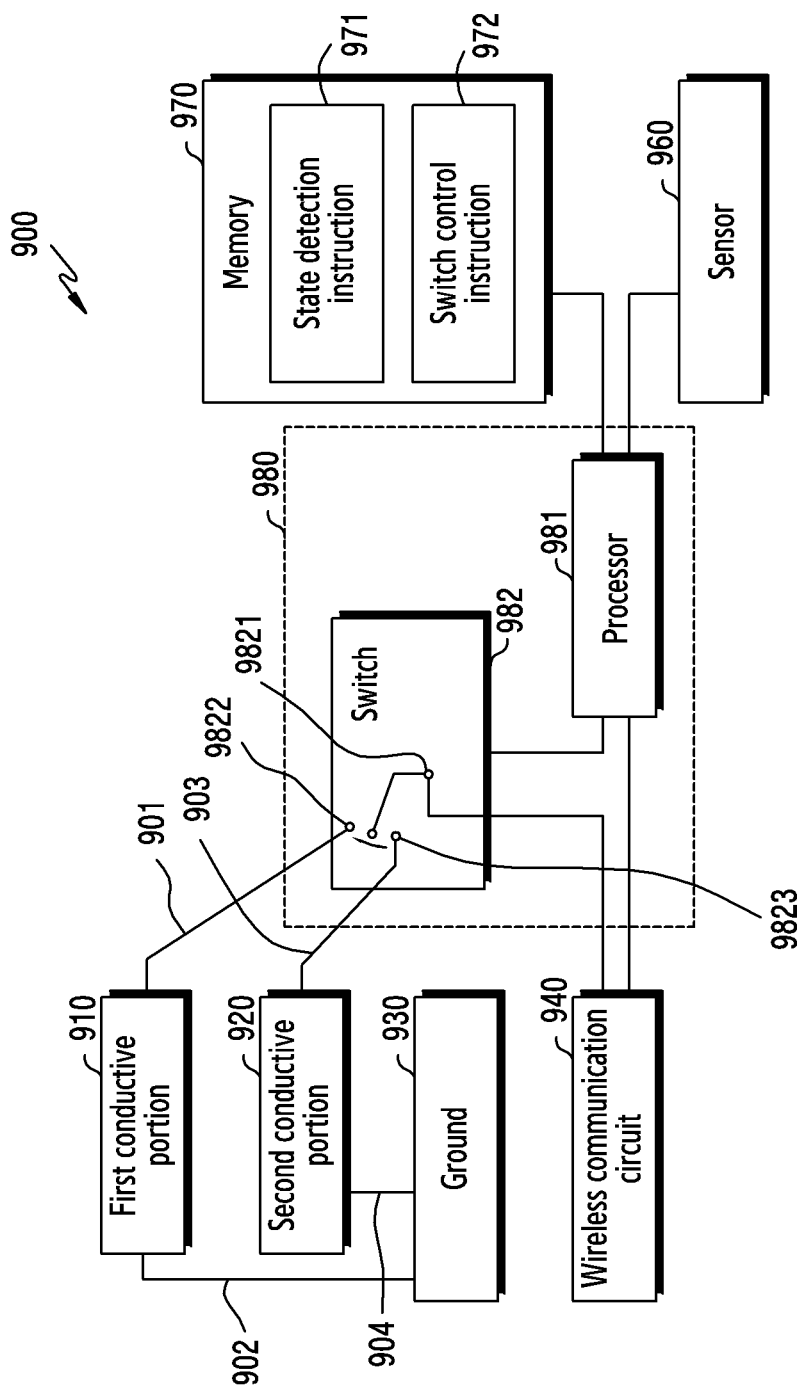
FIG. 9 is a block diagram of an electronic device according to an embodiment.

FIG. 9 is a block diagram of an electronic device according to an embodiment.

Referring to FIG. 9, an electronic device (e.g., the electronic device 101 of FIG. 1 or the electronic device 20 of FIG. 2) may include at least one of at least one first conductive portion 910, at least one second conductive portion 920, a ground 930, a wireless communication circuit 940, at least one sensor 960, a memory 970, or a control circuit 980.

According to an embodiment, the electronic device 900 may include a first housing structure (e.g., the first housing structure 210 of FIG. 2), a second housing structure (e.g., the second housing structure 220 of FIG. 2), and a hinge structure (e.g., the hinge structure 800 of FIG. 7) that connects the first housing structure and the second housing structure. The first housing structure may include a first surface oriented in a first direction, a second surface oriented in a second direction that is opposite to the first direction, and a first side member (e.g., the first side member 211 of FIG. 2 or 3) that surrounds at least a portion of a space between the first surface and the second surface. The second housing structure may include a third surface oriented in a third direction, a fourth surface oriented in a fourth direction that is opposite to the third direction, and a second side member (e.g., the second side member 221 of FIG. 2 or 3) that surrounds at least a portion of a space between the third surface and the fourth surface, and may be folded with the first housing structure about the hinge structure. The first surface faces the third surface in the folded state and the third direction is identical to the first direction in the unfolded state.

According to an embodiment, at least one first conductive portion 910 may be at least one conductive part that defines at least a part of the hinge structure (e.g., the hinge structure 800 of FIG. 7) or is included therein.

According to an embodiment, at least one second conductive portion 920 may at least one conductive part that defines at least a part of the first side member (e.g., the first side member 211) of the first housing structure (e.g., the first housing structure 210 of FIG. 2) or is included therein.

According to an embodiment, the ground 930 may include a ground plane (e.g., the first board 451 of FIG. 4 or the ground plane included in the first printed circuit board 541 of FIG. 5) housed in the first housing structure (e.g., the first housing structure 210 of FIG. 2). The ground 930 may be electrically connected to the at least one first conductive portion 910 through at least one second electrical path 902. The ground 930 may be electrically connected to the at least one second conductive portion 902 through at least one fourth electrical path 904. The ground 930 may function as an antenna ground for at least one antenna (e.g., the at least one conductive portion 910 or the at least one second conductive portion 920).

The wireless communication circuit 940, for example, may set communication between the electronic device 900 and an external electronic device (e.g., the electronic device 101 or 104 or the server 108 of FIG. 1). For example, the wireless communication circuit 940 may be connected to a network (e.g., the first network 198 or the second network 199 of FIG. 1) through a wireless communication and may communicate with an external electronic device.

According to an embodiment, the communication circuit 940 may include at least one of a cellular module, a Wi-Fi module, a Bluetooth module, a GNSS module (e.g., a GPS module, a Glonass module, a Beidou module, or a Galileo module), an NFC module, and a radio frequency (RF) module.

The cellular module, for example, may provide a voice call, a video call, a text message service, or an Internet service through a communication network. According to an embodiment, the cellular module may distinguish and authenticate electronic devices 900 within a communication network using a subscriber identification module (e.g., the subscriber identification module 196). According to an embodiment, the cellular module may perform at least some of the functions that the processor 981 may provide. According to an embodiment, the cellular module may include a communication processor (CP).

The Wi-Fi module, the Bluetooth module, the GNSS module, or the NFC module, for example, may include a processor for processing data transmitted/received through the corresponding module. According to some embodiments, at least some (e.g., two or more) of the cellular module, the Wi-Fi module, the Bluetooth module, the GNSS module, and the NFC module may be included in one Integrated Chip (IC) or one IC package.

The RF module, for example, may transmit and receive a communication signal (e.g., an RF signal). The RF module 729, for example, may include at least one of a transceiver, a power amp module (PAM), a frequency filter, or a low noise amplifier (LNA). According to another embodiment, at least one of the cellular module, the Wi-Fi module, the Bluetooth module, the GNSS module, or the NFC module may transmit and receive an RF signal through a separate RF module.

According to an embodiment, the wireless communication module 940 (e.g., the wireless communication module 192 of FIG. 1) may support various forms of communications (e.g., the first network 198 or the second network 199 of FIG. 1) by utilizing the at least one first conductive portion 910 or at least one second conductive portion 920 as an antenna. The wireless communication circuit 940 may transmit and/or receive a wireless frequency signal through the at least one first conductive portion 910 or at least one second conductive portion 920. The wireless communication circuit 940 may include various RF components (e.g., a radio frequency integrated circuit (RFIC) and a front end module (FEM)) between the antenna (e.g., the at least one first conductive portion 910 or the at least one second conductive portion 920) and the control circuit 980.

For example, during reception of a wireless signal, the wireless communication circuit 940 (e.g., the radio frequency integrated circuit (RFIC)) may receive a wireless signal from the at least one antenna (e.g., the at least one first conductive portion 910 or the at least one second conductive portion 920), convert the received wireless signal to a baseband signal, and transmit the obtained baseband signal to the processor 981. The processor 981 may process the received baseband signal, and may control a human/mechanical interface of the electronic device 900 corresponding to the received baseband signal. For example, during transmission of the wireless signal, the processor 981 may generate a baseband signal and output the generated baseband signal to the wireless communication circuit 940. The wireless communication circuit 940 may receive the baseband signal from the processor 981, convert the received baseband signal to a wireless signal, and transmit the wireless signal in air through the at least one antenna (e.g., the at least one first conductive portion 910 or the at least one second conductive portion 920.

For example, the wireless communication circuit 940 (e.g., the FEM) may include a transmitter device that may control electric wave signals. The wireless communication circuit 940 may connect the at least one antenna and the RFIC and separate the transmission/reception signal. For example, the FEM may filter and amplify a signal, and may include a reception terminal front end module embedding a filter that filters a received signal, and a transmission terminal front end module embedding a power amplifier module that amplifies a transmission signal.

According to various embodiments, the wireless communication circuit 940 may support at least one communication scheme of single input multiple output (SIMO), multiple input single output (MISO), diversity, or multiple input multiple output (MIMO) by using the at least one antenna (e.g., the at least one first conductive portion 910 or the at least one second conductive portion 920).

According to various embodiments, the wireless communication circuit 940 may process a transmission signal or a reception signal at least one designated frequency band by using the at least one antenna (e.g., the at least one first conductive portion 910 or the at least one second conductive portion 920). For example, the designated frequency band may include at least one of a low band (LB) (about 600 to 1 GHz), a middle band (MB) (about 1 to 2.2 GHz), a high band (HB) (about 2.2 to 2.7 GHz), or an ultra-high band (UHB) (about 2.7 to 3.6 GHz).

According to an embodiment, the control circuit 980 may include a processor 981 and a switch 982. The processor 981 may be electrically connected to the wireless communication circuit 940, the switch 982, the memory 970, and/or the at least one sensor 960. The processor 981 may control the switch 982 according to instructions stored in the memory 970.

The memory 970, for example, may store instructions for controlling the switch 982 by the processor 981. According to an embodiment, the memory 970 may store at least one of a state detection instruction 971 or a switch control instruction 972.

According to an embodiment, the state detection instruction 971 may include routines that allow the processor 981 to detect the unfolded state (see FIG. 2) or the folded state (see FIG. 3) of the electronic device 900 by using the at least one sensor 960.

According to an embodiment, the at least one sensor 960 may include a proximity sensor (e.g., in FIG. 2, the proximity sensor disposed in the component arrangement area 214 of the first housing structure 210). For example, when the electronic device 900 is in the folded state (see FIG. 3), the proximity sensor disposed in the first housing structure (e.g., the first housing structure 210 of FIG. 3) may output an electrical signal regarding proximity of the second housing structure (e.g., the second housing structure 220 of FIG. 3).

According to another embodiment, the at least one sensor 960 may include a Hall integrated circuit (IC). For example, the first housing structure (e.g., the first housing structure 210 of FIG. 2) may include a Hall IC, and the second housing structure (e.g., the second housing structure 220 of FIG. 2) may include a magnet. When the electronic device 900 is in the folded state (see FIG. 3), the Hall IC disposed in the first housing structure and the magnet disposed in the second housing structure are arranged, and the Hall IC may recognize the magnet and output an electrical signal.

According to another embodiment, the at least one sensor 960 may include an image sensor (e.g., in FIG. 2, the front sensor disposed in the component arrangement area 214 of the first housing structure 210). For example, the image sensor disposed in the first housing structure (e.g., the first housing structure 210 of FIG. 3) may acquire image data regarding the second housing structure (e.g., the second housing structure 220 of FIG. 3), and the processor 981 may identify, based on the image data, the unfolded state or the folded state of the electronic device 900.

According to various embodiments, the unfolded state or the folded state of the electronic device 900 may be detected by using other various sensors.

According to some embodiments, the first housing structure (e.g., the first housing structure 210 of FIG. 2) may include a first contact, and the second housing structure (e.g., the second housing structure 220 of FIG. 2) may include a second contact. When the electronic device 900 is in the folded state (see FIG. 3), the first contact disposed in the first housing structure and the second contact disposed in the second housing structure may physically contact each other to permit flows of currents, and the processor 981 may recognize the folded state based on the flows of the currents.

According to an embodiment, the switch control instructions 972 may include a routine that allows the processor 981 to, based on the unfolded state or the folded state of the electronic device 900, control switch 982. According to an embodiment, the at least one conductive portion (e.g., the at least one first conductive portion 910 or the at least one second conductive portion 920) that may secure, based on the unfolded state or the folded state, an antenna radiation performance may be selectively electrically connected to the wireless communication circuit 940.

According to an embodiment, when the electronic device 900 is in the folded state (see FIG. 3), the processor 981 may control the switch 982 such that the at least one first conductive portion 910 of the at least one first conductive portion 910 and the at least one second conductive portion 920 is electrically connected to the wireless communication circuit 940. When the electronic device 900 is in the folded state, the at least one first conductive portion 910 of the hinge structure (e.g., the hinge structure 800 of FIG. 7) at least partially may not be covered by the first side member (e.g., the first side member 211 of FIG. 3) and the second side member (e.g., the second side member 221 of FIG. 3), and thus may be utilized as an antenna in the folded state of the electronic device 900.

According to an embodiment, when the electronic device 900 is in the unfolded state (see FIG. 2), the processor 981 may control the switch 982 such that the at least one second conductive portion of the at least one first conductive portion 910 or the at least one second conductive portion 920 is electrically connected to the wireless communication circuit 940.

According to an embodiment, the switch 982 may include a first terminal 9821 electrically connected to the wireless communication circuit 940, a second terminal 9822 electrically connected to the at least one first conductive portion 910, or a third terminal 9823 electrically connected to the at least one second conductive portion 920. In the folded state of the electronic device 900, the switch 982 may electrically connect the first terminal 9821 and the second terminal 9822. In the unfolded state of the electronic device 900, the switch 982 may electrically connect the first terminal 9821 and the third terminal 9823.

According to an embodiment, the electronic device 900 may include a first electrical path 901 that electrically connects the at least one first conductive portion 910 and the switch 982. According to various embodiments, the first electrical path 901 may include a first contact (not illustrated) disposed at the at least one first conductive portion 910 or electrically connected thereto, and a second first contact (not illustrated) disposed at the at least one second terminal 9822 of the switch 982 or electrically connected thereto. When the electronic device 900 is in the folded state, the first contact and the second contact may physically contact each other, and the at least one first conductive portion 910 and the second terminal 9822 of the switch 982 may be electrically connected to each other. When the electronic device 900 is in the unfolded state, the first contact and the second contact may be physically separated each other, and the at least one first conductive portion 910 and the second terminal 9822 of the switch 982 may not be electrically connected to each other. According to various embodiments, the first contact or the second contact may include a flexible conductive member (e.g., a C clip, a pogo pin, a spring, conductive poron, conductive rubber, or a conductive tape), and the first contact and the second contact may elastically contact each other.

In some embodiments (not illustrated), the first electrical path 901 may be implemented to have the first contact disposed at the at least one conductive portion 910 or electrically connected thereto, and the second contact disposed in the wireless communication circuit 940 or electrically connected thereto. For example, the first contact and the second contact may physically contact or be separated from each other according to the folded state or the unfolded state of the electronic device 900, and the first conductive portion 910 and the wireless communication circuit 940 may be or may not be electrically connected to each other without any switch 982 according to the unfolded state or the folded state of the electronic device 900. In this case, the electronic device 900 may have a switch that allows only the at least one second conductive portion 920 to be connected to or disconnected from the wireless communication circuit 940, based on the folded state or the unfolded state, and a method for controlling the same.

According to various embodiments, the second electrical path 902 may include a third contact (not illustrated) disposed at the at least one first conductive portion 910 or electrically connected thereto, and a fourth contact (not illustrated) disposed in the ground 930 or electrically connected thereto. When the electronic device 900 is in the folded state, the third contact and the fourth contact may physically contact each other, and the at least one first conductive portion 910 and the ground 930 may be electrically connected to each other. When the electronic device 900 is in the unfolded state, the third contact and the fourth contact may physically contact each other, and the at least one first conductive portion 910 and the ground 930 may not be electrically connected to each other. According to various embodiments, the third contact or the fourth contact may include a flexible conductive member (e.g., a C clip, a pogo pin, a spring, conductive poron, conductive rubber, or a conductive tape), and the third contact and the fourth contact may elastically contact each other.

According to various embodiments, the electronic device 900 may include a third electrical path 903 that electrically connects the at least one second conductive portion 920 and the switch 982. The third electrical path 903 may be implemented by various conductive paths such as a flexible printed circuit or a cable. According to various embodiments, the third electrical path 903 may include a fifth contact disposed at the at least one second conductive portion 920 or electrically connected thereto, and a sixth contact (not illustrated) disposed at the at least one third terminal 9823 of the switch 982 or electrically connected thereto. According to various embodiments, the fifth contact or the sixth contact may include a flexible conductive member (e.g., a C clip, a pogo pin, a spring, conductive poron, conductive rubber, or a conductive tape), and the fifth contact and the sixth contact may elastically contact each other.

According to various embodiments, the fourth electrical path 904 may be implemented by various conductive paths such as an FPC or a cable. According to various embodiments, the fourth electrical path 904 may include a seventh contact disposed at the at least one second conductive portion 920 or electrically connected thereto, and an eighth contact (not illustrated) disposed at the ground 930 or electrically connected thereto. According to various embodiments, the seventh contact or the eighth contact may include a flexible conductive member (e.g., a C clip, a pogo pin, a spring, conductive poron, conductive rubber, or a conductive tape), and the seventh contact and the eighth contact may elastically contact each other.

Figure 10:
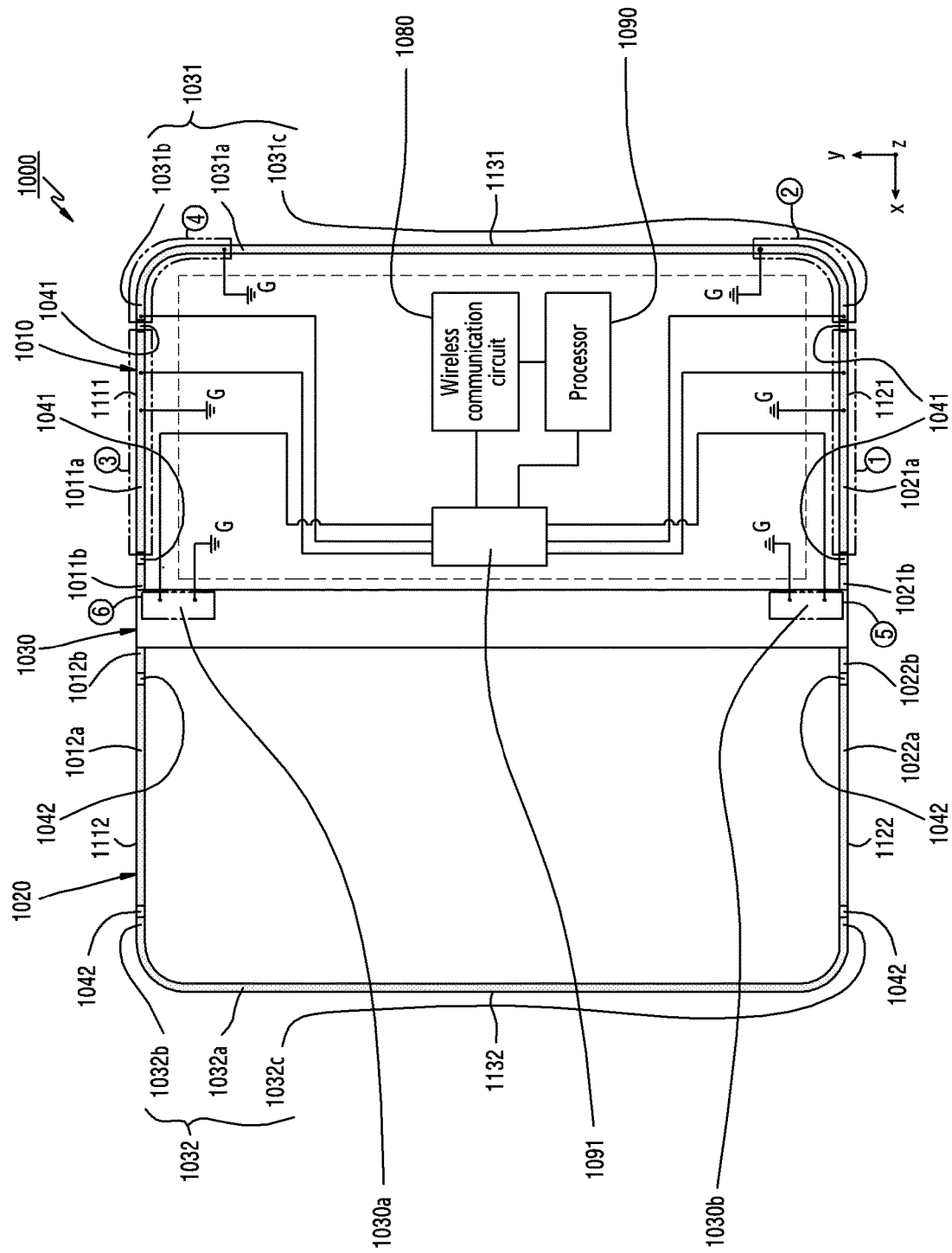
FIG. 10 illustrates an electronic device according to an embodiment.

FIG. 10 illustrates an electronic device according to an embodiment.

Referring to FIG. 10, in an embodiment, an electronic device 1000 (e.g., the electronic device 102 of FIG. 1 or the electronic device 20 of FIG. 2) may include at least one of a first side member 1010 (e.g., the first side member 211 of FIG. 2), a second side member 1020 (e.g., the second side member 221 of FIG. 2), a hinge structure 1030 (e.g., the hinge structure 800 of FIG. 7), a wireless communication circuit 1080 (e.g., the wireless communication module 192 of FIG. 1 or the wireless communication module 940 of FIG. 9), a processor 1090 (e.g., the processor 120 of FIG. 1 or the processor 681 of FIG. 9), or a switch 1091 (e.g., the switch 982 of FIG. 9).

According to an embodiment, the electronic device 1000 may include first side surfaces 1111 and 1112 oriented in a first direction, second side surfaces 1121 and 1122 oriented in a second direction that is opposite to the first direction, and third side surfaces 1131 and 1132 oriented in a third direction that is perpendicular to the first direction.

The first side surfaces 1111 and 1112, for example, may include a first side surface 1111 defined by a first side member 1010, and a first side surface 1112 defined by a second side member 1020. When the electronic device 1000 is in the unfolded state or the folded state (not illustrated), the first side surfaces 1111 and 1112 may define one side surface of the electronic device 1000 together. The second side surfaces 1121 and 1112, for example, may include a second side surface 1121 defined by the first side member 1010, and a second side surface 1122 defined by the second side member 1020. When the electronic device 1000 is in the unfolded state or the folded state (not illustrated), the second side surfaces 1121 and 1112 may define another side surface of the electronic device 1000 together.

The third side surfaces 1131 and 1132, for example, may include a third side surface 1131 defined by the first side member 1010, and a third side surface 1132 defined by the second side member 1020. As illustrated, when the electronic device 1000 is in the unfolded state, the third side surfaces 1131 and 1132 may be disposed to be oriented in opposite directions. When the electronic device 1000 is in the folded state (not illustrated), the third side surfaces 1131 and 1132 may define one side surface of the electronic device 1000 together.

According to an embodiment, the hinge structure 1030 may include one or more first conductive portions 1030a and 1030b (e.g., the at least first conductive portion 910 of FIG. 9).

The first side member 1010, for example, may include a plurality of second conductive portions 1011a, 1011b, 1021a, 1021b, 1031 (e.g., the at least one second conductive portion 920 of FIG. 9) that are physically or electrically separated from each other. According to an embodiment, two second conductive portions 1011a and 1011b may define a part of the first side surface 1111. Other two second conductive portions 1021a and 1021b may define a part of the second side surface 1121. Another second conductive portion 1031 may include a portion 1031a that defines the third side surface 1131, a portion 1031b that defines a portion of the first side surface 1111, and a portion 1031c that defines a portion of the second side surface 1112. In an embodiment, gaps (or slits) 1041 may be disposed between the plurality of second conductive portions 1011a, 1011b, 1021a, 1021b, and 1031, and nonconductive members (e.g., the nonconductive members 371 of FIG. 3) may be disposed in the gaps 1041 to define the first side surface 1111 and the second side surface 1121.

The second side member 1020, for example, may include a plurality of third conductive portions 1012a, 1012b, 1022a, 1022b, and 1032 that are physically or electrically separated from each other. According to an embodiment, two third conductive portions 1012a and 1012b may define a part of the first side surface 1112. Other two third conductive portions 1022a and 1022b may define a part of the second side surface 1122. Another third conductive portion 1032 may include a portion 1032a that defines the third side surface 1132, a portion 1032b that defines a portion of the first side surface 1111, and a portion 1032c that defines a portion of the second side surface 1112. In an embodiment, gaps (or slits) 1042 may be disposed between the plurality of third conductive portions 1012a, 1012b, 1022a, 1022b, and 1032, and nonconductive members (e.g., the nonconductive members 372 of FIG. 3) may be disposed in the gaps 1042 to define the first side surface 1112 and the second side surface 1122 together with the second side member 1020.

According to an embodiment, at least one of the one or more first conductive portions 1030*a* and 1030*b* of the hinge structure 1030 or the plurality of second conductive portions 1011*a*, 1011*b*, 1021*a*, 1021*b*, and 1031 of the first side member 1010 may be electrically connected to the wireless communication circuit 1080 (e.g., the radio frequency integrated circuit (RFIC) or the intermediate frequency integrated circuit (IFIC)) and may be utilized as an antenna. The reflection characteristics and the impedance of the first conductive portion or the second conductive portion utilized as an antenna are related to the antenna radiation performance, and may be various according to the shape, the size, and the material thereof. The radiation characteristics of the first conductive portion or the second conductive portion may include an antenna radiation pattern (or an antenna pattern) that is a directional function representing a relative distribution of electric power radiated from the first conductive portion or the second conductive pattern, and a polarization state (or an antenna polarization) of electric waves radiated from the first conductive portion or the second conductive portion. The impedance of the first conductive portion or the second conductive portion may be related to transmission of power from a transmitter to the first conductive portion or the second conductive portion or transmission of power from the first conductive portion or the second conductive portion to a receiver. In order to minimize reflection in a connection part between the transmission line and the first conductive portion or the second conductive portion, the impedance of the first conductive portion or the second conductive portion is designed to match with the impedance of the transmission line, and accordingly, maximum power may be transmitted (or loss of power may be minimized) or signals may be delivered efficiently through the first conductive portion or the second conductive portion. The impedance match may derive efficient flows of signals at a specific frequency. The transmission line, for example, is a structure for delivering a signal (a voltage or a current) of a radio frequency (RF), and may be defined as a conductor system that uses an operation of delivering waves by an electrical medium parameter (e.g., a resistance, an inductance, a conductance, or a capacitance per unit length).

For example, the second conductive portion 1021*a* that forms a part of the second side surface 1121 may be operated as a first antenna ①. The first antenna ① may be electrically connected to the wireless communication circuit 1080 on at least one feeding point (not illustrated), and may be electrically connected to the ground G (e.g., the ground 930 of FIG. 9) on at least one grounding point (not illustrated). The wireless communication circuit 1080 may provide a current to the first antenna ①, a first transmission line that may transmit or receive wireless electromagnetic waves may be formed as the current is delivered along the first antenna ① and is introduced into the ground G.

For example, parts of the second conductive portions 1031 that are disposed on opposite sides of a corner between the second side surface 1121 and the third side surface 1131 to define a part of the third side surface 1131 and a part of the second side surface 1121 may be operated as second antennas ②. The second antenna ② may be electrically connected to the wireless communication circuit 1080 on at least one feeding point (not illustrated), and may be electrically connected to the ground G on at least one grounding point (not illustrated). The wireless communication circuit 1080 may provide a current to the second antenna ②, a first transmission line that may transmit or receive wireless electromagnetic waves may be formed as the current is delivered along the second antenna ② and is introduced into the ground G.

For example, the second conductive portion 1011*a* that forms a part of the first side surface 1111 may be operated as a third antenna ③. The third antenna ③ may be electrically connected to the wireless communication circuit 1080 on at least one feeding point (not illustrated), and may be electrically connected to the ground G on at least one grounding point (not illustrated). The wireless communication circuit 1080 may provide a current to the third antenna ③, a third transmission line that may transmit or receive wireless electromagnetic waves may be formed as the current is delivered along the third antenna ③ and is introduced into the ground G.

For example, parts of the second conductive portions 1031 that are disposed on opposite sides of a corner between the third side surface 1131 and the third side surface 1131 to define a part of the third side surface 1131 and a part of the first side surface 1111 may be operated as second antennas ④. The fourth antenna ④ may be electrically connected to the wireless communication circuit 1080 on at least one feeding point (not illustrated), and may be electrically connected to the ground G on at least one grounding point (not illustrated). The wireless communication circuit 1080 may provide a current to the fourth antenna ④, a fourth transmission line that may transmit or receive wireless electromagnetic waves may be formed as the current is delivered along the fourth antenna ④ and is introduced into the ground G.

For example, the first conductive portion 1030*a* of the hinge structure 1030, which is adjacent to the second conductive portion 1011*b* that defines a part of the first surface 1111 may be operated as a fifth antenna ⑤. The fifth antenna ⑤ may be electrically connected to the wireless communication circuit 1080 on at least one feeding point (not illustrated), and may be electrically connected to the ground G on at least one grounding point (not illustrated). The wireless communication circuit 1080 may provide a current to the fifth antenna ⑤, a fifth transmission line that may transmit or receive wireless electromagnetic waves may be formed as the current is delivered along the fifth antenna ⑤ and is introduced into the ground G.

For example, the second conductive portion 1032 of the hinge structure 1030, which is adjacent to the second conductive portion 1030 that defines a part of the second surface 1111 may be operated as a sixth antenna ⑥. The sixth antenna ⑥ may be electrically connected to the wireless communication circuit 1080 on at least one feeding point (not illustrated), and may be electrically connected to the ground G on at least one grounding point (not illustrated). The wireless communication circuit 1080 may provide a current to the sixth antenna ⑥, a sixth transmission line that may transmit or receive wireless electromagnetic waves may be formed as the current is delivered along the sixth antenna ⑥ and is introduced into the ground G.

According to an embodiment, when the electronic device 1000 is in the folded state (see FIG. 3), the processor 1090 may control the switch 1091 to electrically connect, among the first antenna ①, the second antenna ②, the third antenna ③, the fourth antenna ④, the fifth antenna ⑤, and the sixth antenna ⑥, the fifth antenna ⑤ and/or the sixth antenna ⑥ to the wireless communication circuit 1080. When the electronic device 1000 is in the folded state, the at least one first conductive portion 1030a or 1030b included in the hinge structure 1030 may not be covered by the first side member 1010 and the second side member 1020, and thus may be utilized as an antenna in the folded state of the electronic device 1000.

According to an embodiment, when the electronic device 1000 is in the unfolded state (see FIG. 2), the processor 1090 may control the switch 1091 to electrically connect, among the first antenna ①, the second antenna ②, the third antenna ③, the fourth antenna ④, the fifth antenna ⑤ and the sixth antenna ⑥, the first antenna ①, the second antenna ②, the third antenna ③, and/or the fourth antenna ④, to the wireless communication circuit 1080. When the electronic device 1000 is in the unfolded state, the at least one second conductive portion 1011a, 1021a, or 1031 included in the first side member 1010 may be utilized as an antenna.

Figure 11:
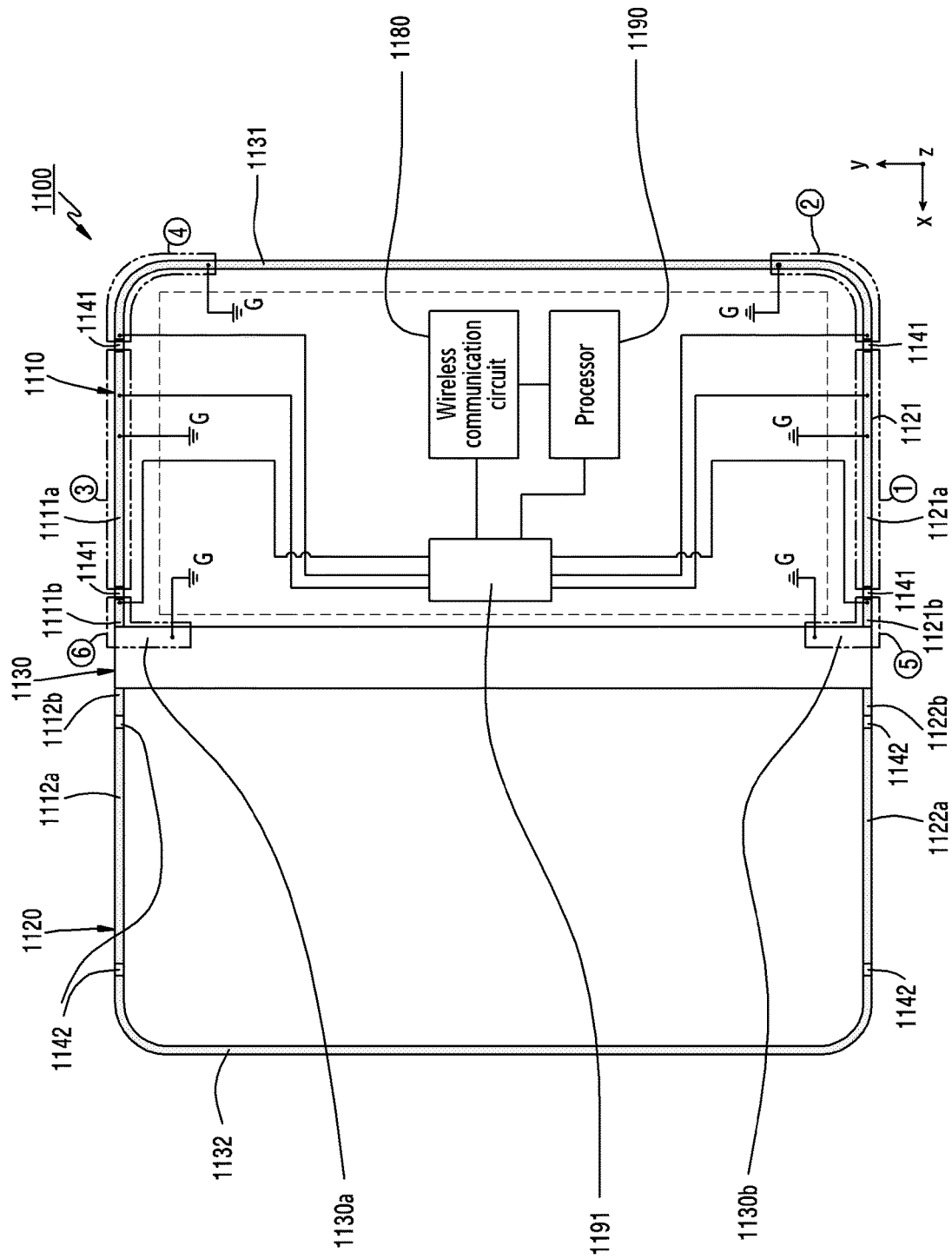
FIG. 11 illustrates an electronic device according to an embodiment.

FIG. 11 illustrates an electronic device according to an embodiment.

Referring to FIG. 11, in an embodiment, an electronic device 1100 (e.g., the electronic device 102 of FIG. 1 or the electronic device 20 of FIG. 2) may include at least one of a first side member 1110 (e.g., the first side member 211 of FIG. 2), a second side member 1120 (e.g., the second side member 221 of FIG. 2), a hinge structure 1130 (e.g., the hinge structure 800 of FIG. 7), a wireless communication circuit 1180 (e.g., the wireless communication module 192 of FIG. 1 or the wireless communication module 940 of FIG. 9), a processor 1190 (e.g., the processor 120 of FIG. 1 or the processor 981 of FIG. 9), or a switch 1191 (e.g., the switch 982 of FIG. 9). The first side member 1110, the second side member 1120, and the hinge structure 1130 are the same as those of FIG. 10, and a detailed description thereof will be omitted.

According to an embodiment, the hinge structure 1130 may include one or more first conductive portions 1130a and 1030b (e.g., the at least first conductive portion 910 of FIG. 9).

The first side member 1110, for example, may include a plurality of second conductive portions 1111a, 1111b, 1121a, 1021b, 1131 (e.g., the at least one second conductive portion 920 of FIG. 9) that are physically or electrically separated from each other. Nonconductive members (e.g., the nonconductive members 371 of FIG. 1) may be arranged in gaps 1141 between the plurality of second conductive portions 111a, 111b, 1121a, 1121b, and 1131.

The second side member 1120, for example, may include a plurality of third conductive portions 1112a, 1112b, 1122a, 1122b, and 1132 that are physically or electrically separated from each other. Nonconductive members (e.g., the nonconductive members 372 of FIG. 3) may be arranged in gaps 1142 between the plurality of third conductive portions 1112a, 1112b, 1122a, 1122b, and 1132.

According to an embodiment, the electronic device 1100 may have the first antenna ①, the second antenna ②, the third antenna ③, or the fourth antenna ④ that utilizes the first side member 1110, and are substantially the same as that of FIG. 10, and a detailed description thereof will be omitted.

According to an embodiment, the second conductive portion 1121b that is adjacent to the hinge structure 1130 and the first conductive portion 1130b included in the hinge structure 1130 electrically connected to the second conductive portion 1121b may be operated as the fifth antenna ⑤. The second conductive portion 1121b may be electrically connected to the wireless communication circuit 1180 on at least one feeding point (not illustrated). The first conductive portion 1130b of the hinge structure 1130 may be electrically connected to the ground G on at least one grounding point (not illustrated). The wireless communication circuit 1180 may provide a current to the fifth antenna ⑤, a transmission line that may transmit or receive wireless electromagnetic waves may be formed as the current is delivered along the fifth antenna ⑤ and is introduced into the ground G.

According to an embodiment, the second conductive portion 1111b that is adjacent to the hinge structure 1130 and the first conductive portion 1130a included in the hinge structure 1130 electrically connected to the second conductive portion 1111b may be operated as the sixth antenna ⑥. The second conductive portion 1111b may be electrically connected to the wireless communication circuit 1180 on at least one feeding point (not illustrated). The first conductive portion 1130a of the hinge structure 1130 may be electrically connected to the ground G on at least one grounding point (not illustrated). The wireless communication circuit 1180 may provide a current to the sixth antenna ⑥, a transmission line that may transmit or receive wireless electromagnetic waves may be formed as the current is delivered along the sixth antenna ⑥ and is introduced into the ground G.

According to an embodiment, when the electronic device 1100 is in the folded state (see FIG. 3), the processor 1190 may control the switch 1191 to electrically connect, among the first antenna ①, the second antenna ②, the third antenna ③, the fourth antenna ④, the fifth antenna ⑤, and the sixth antenna ⑥, the fifth antenna ⑤ and/or the sixth antenna ⑥ to the wireless communication circuit 1180. When the electronic device 1100 is in the folded state, the fifth antenna ⑤ or the sixth antenna ⑥ may secure antenna radiation performance.

According to an embodiment, when the electronic device 1100 is in the unfolded state (see FIG. 2), the processor 1090 may control the switch 1191 to electrically connect, among the first antenna ①, the second antenna ②, the third antenna ③, the fourth antenna ④, the fifth antenna ⑤ and the sixth antenna ⑥, the first antenna ①, the second antenna ②, the third antenna ③, and/or the fourth antenna ④, to the wireless communication circuit 1180. When the electronic device 1100 is in the unfolded state, the first antenna ①, the second antenna ②, the third antenna ③, or the fourth antenna ④ may secure antenna radiation performance.

Figure 12:
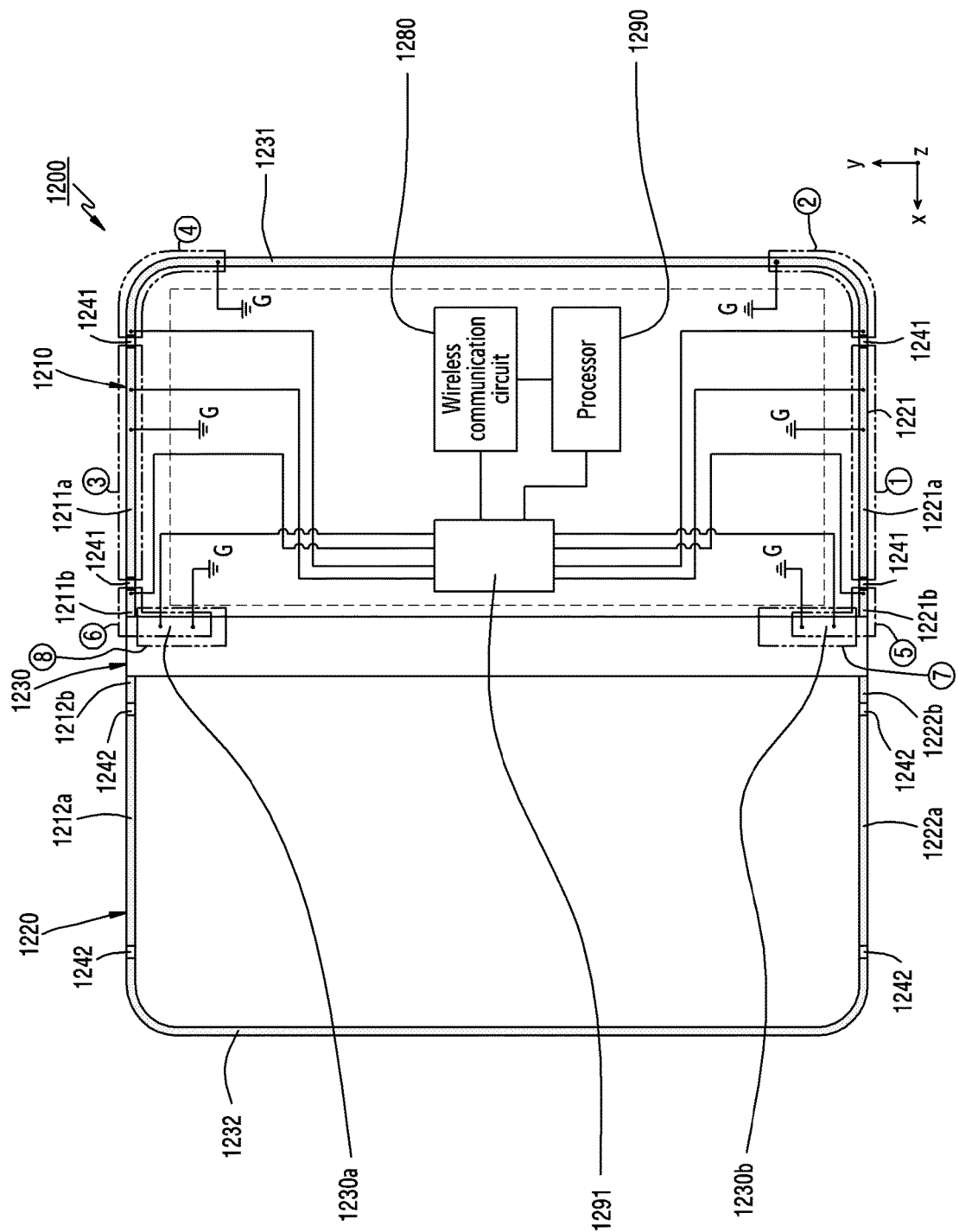
FIG. 12 illustrates an electronic device according to an embodiment.

FIG. 12 illustrates an electronic device according to an embodiment.

Referring to FIG. 12, in an embodiment, an electronic device 1200 (e.g., the electronic device 102 of FIG. 1 or the electronic device 20 of FIG. 2) may include at least one of a first side member 1210 (e.g., the first side member 211 of FIG. 2), a second side member 1220 (e.g., the second side member 221 of FIG. 2), a hinge structure 1230 (e.g., the hinge structure 800 of FIG. 7), a wireless communication circuit 1280 (e.g., the wireless communication module 192 of FIG. 1 or the wireless communication module 940 of FIG. 9), a processor 1290 (e.g., the processor 120 of FIG. 1 or the processor 981 of FIG. 9), or a switch 1291 (e.g., the switch 982 of FIG. 9). The first side member 1210, the second side member 1220, and the hinge structure 1230 are the same as those of FIG. 10, and a detailed description thereof will be omitted.

According to an embodiment, the hinge structure 1230 may include one or more first conductive portions 1230a and 1230b (e.g., the at least first conductive portion 910 of FIG. 9).

The first side member 1210, for example, may include a plurality of second conductive portions 1211a, 1211b,

1221*a*, 1021*b*, 1231 (e.g., the at least one second conductive portion 920 of FIG. 9) that are physically or electrically separated from each other. Nonconductive members (e.g., the nonconductive members 371 of FIG. 2) may be arranged in gaps 1241 between the plurality of third conductive portions 1211*a*, 1211*b*, 1221*a*, 1221*b*, and 1231.

The second side member 1220, for example, may include a plurality of third conductive portions 1212*a*, 1212*b*, 1222*a*, 1222*b*, and 1232 that are physically or electrically separated from each other. Nonconductive members (e.g., the nonconductive members 272 of FIG. 2) may be arranged in gaps 1242 between the plurality of third conductive portions 1212*a*, 1212*b*, 1222*a*, 1222*b*, and 1232.

According to an embodiment, the electronic device 1100 may have the first antenna ①, the second antenna ②, the third antenna ③, the fourth antenna ④, the fifth antenna ⑤, or the sixth antenna ⑥ that utilizes the first side member 1110, and are substantially the same as that of FIG. 10, and a detailed description thereof will be omitted.

According to an embodiment, the second conductive portion 1221*b* that is adjacent to the hinge structure 1230 and the first conductive portion 1230*b* included in the hinge structure 1230 electrically connected to the second conductive portion 1221*b* may be operated as the seventh antenna ⑦. The seventh antenna ⑦ is substantially the same as the fifth antenna ⑤ of FIG. 11, and thus a detailed description thereof will be omitted.

According to an embodiment, the second conductive portion 1211*b* that is adjacent to the hinge structure 1230 and the first conductive portion 1230*a* included in the hinge structure 1230 electrically connected to the second conductive portion 1211*b* may be operated as the eighth antenna ⑧. The eighth antenna ⑧ is substantially the same as the sixth antenna ⑥ of FIG. 11, and thus a detailed description thereof will be omitted.

According to an embodiment, when the electronic device 1200 is in the folded state (see FIG. 3), the processor 1290 may control the switch 1291 to electrically connect, among the first antenna ①, the second antenna ②, the third antenna ③, the fourth antenna ④, the fifth antenna ⑤, the sixth antenna ⑥, the seventh antenna ⑦, and the eighth antenna ⑧, the fifth antenna ⑤, the sixth antenna ⑥, the seventh antenna ⑦, or the eighth antenna ⑧, to the wireless communication circuit 1280.

According to an embodiment, when the electronic device 1200 is in the unfolded state (see FIG. 2), the processor 1290 may control the switch 1291 to electrically connect, among the first antenna ①, the second antenna ②, the third antenna ③, the fourth antenna ④, the fifth antenna ⑤, the sixth antenna ⑥, the seventh antenna ⑦, and the eighth antenna ⑧, to the first antenna ①, the second antenna ②, the third antenna ③, or the fourth antenna ④, to the wireless communication circuit 1280.

Figure 13:
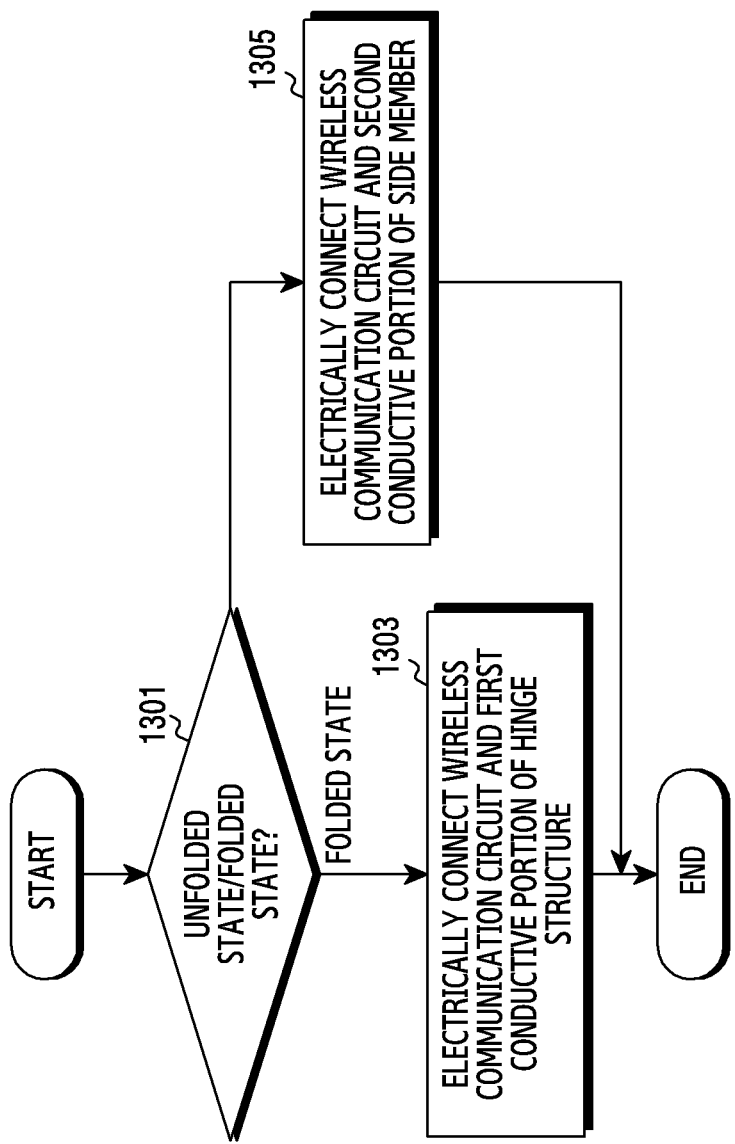
FIG. 13 illustrates an operational flow of an electronic device according to an embodiment.
Figure 14A:
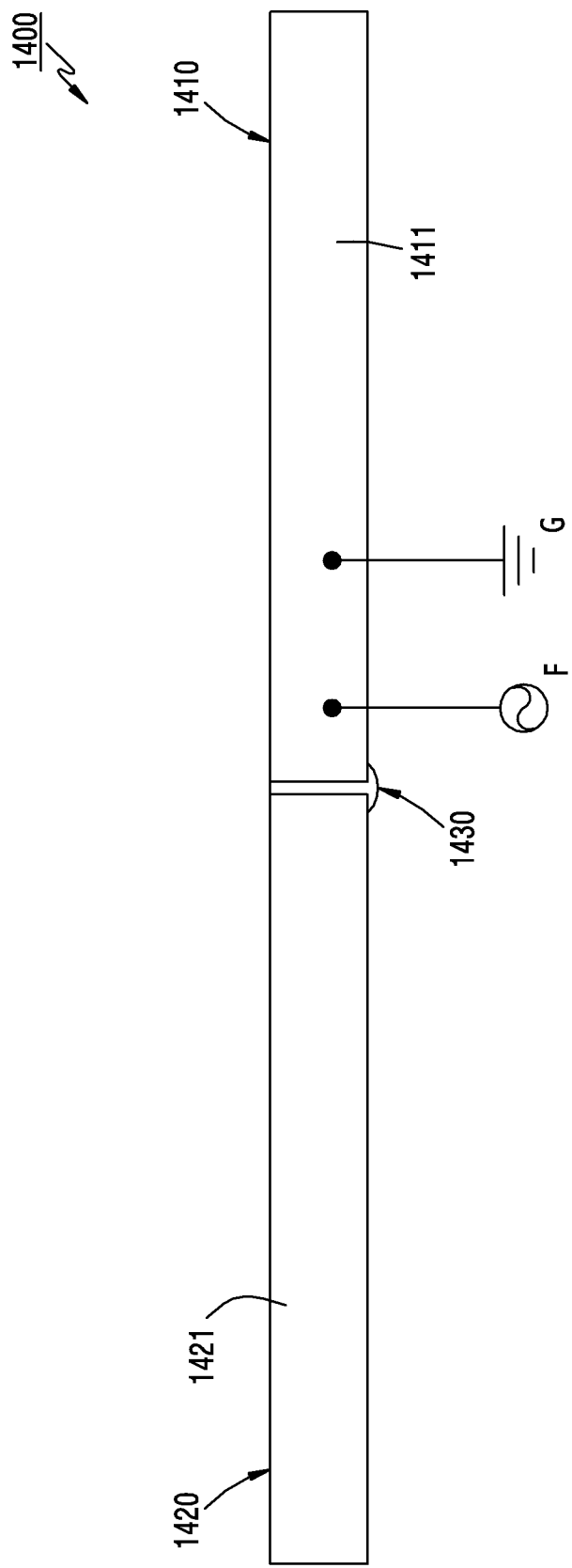
FIG. 14A illustrates an unfolded state of an electronic device according to an embodiment.
Figure 16:
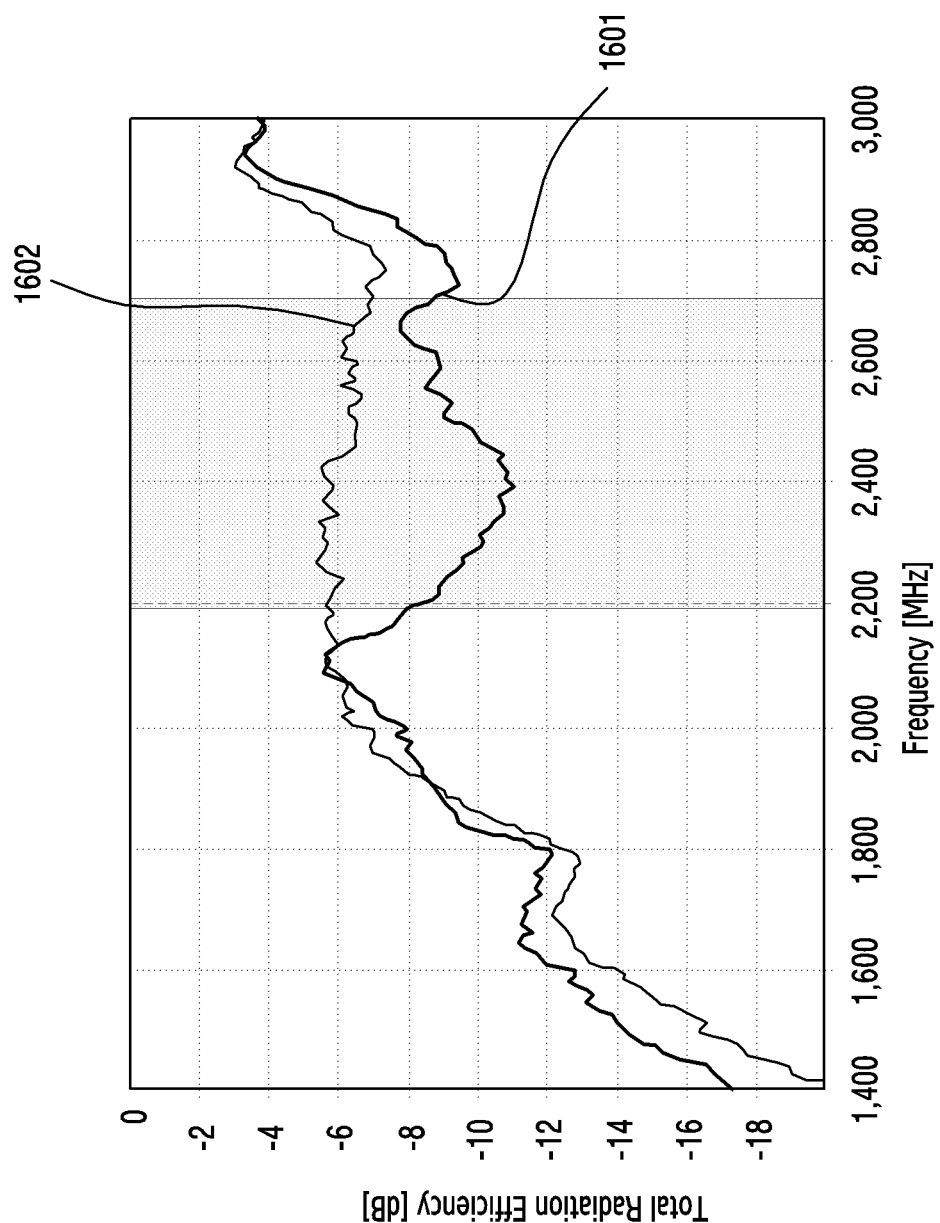
FIG. 16 is a graph depicting antenna radiation performance when at least one first conductive portion of a hinge structure is utilized as an antenna in a state, in which an electronic device is unfolded or folded.

FIG. 13 illustrates an operational flow of an electronic device according to an embodiment. FIG. 14A illustrates an unfolded state of an electronic device according to an embodiment. FIG. 14B illustrates a folded state of an electronic device according to an embodiment. FIG. 15 is a graph depicting antenna radiation performance when at least one second conductive portion of a side member is utilized as an antenna in a state, in which an electronic device is unfolded or folded. FIG. 16 is a graph depicting antenna radiation performance when at least one first conductive portion of a hinge structure is utilized as an antenna in a state, in which an electronic device is unfolded or folded.

According to various embodiments, the electronic device may include the electronic device 101 of FIG. 1, the electronic device 20 of FIG. 2, 3, or 4, the electronic device 500 of FIG. 5 or 6, the electronic device 900 of FIG. 9, the electronic device 1000 of FIG. 10, the electronic device 1100 of FIG. 11, or the electronic device 1200 of FIG. 12.

Referring to FIG. 13, in an embodiment, in operation 1301, the processor may determine whether the electronic device is in the unfolded state or the folded state. According to various embodiments, the processor may detect an unfolded state or a folded state of the electronic device by utilizing at least one sensor (e.g., the sensor module 176 of FIG. 1 or the at least one sensor 960 of FIG. 9). According to various embodiments, the processor may be the processor 120 of FIG. 1, the processor 981 of FIG. 9, the processor 1090 of FIG. 10, the processor 1190 of FIG. 11, or the processor 1290 of FIG. 12.

Referring to FIGS. 14A and 14B, the electronic device 2000 may include a first housing structure 1410, a second housing structure 1420, and a hinge structure 1430. The first housing structure 1410 and the second housing structure 1420 may be connected to each other by a hinge structure 1430, and the electronic device 1400 may be in the unfolded state illustrated in FIG. 14A or the folded state illustrated in FIG. 14B. According to an embodiment, the first housing structure 1410 may include a first side member that defines at least a part of a side surface thereof, and the first side member may include at least one second conductive portion 1411. The second housing structure 1420 may include a second side member that defines at least a part of a side surface thereof, and the second side member may include at least one third conductive portion 1421. The hinge structure 1430 may include at least one first conductive portion 1431.

Referring to FIGS. 13 and 14B, in an embodiment, when the folded state of the electronic device 1400 is identified, in operation 1303, the wireless communication circuit and the at least one first conductive portion 1431 of the hinge structure 1430 may be electrically connected to each other. The at least one first conductive portion 1431 may be electrically connected to the ground G of the electronic device 1400. A current may be fed (F) from the wireless communication circuit to the at least one first conductive portion 1431, and a transmission line that may transmit or receive wireless electromagnetic waves may be formed as the current is delivered along the at least one first conductive portion 1431 and is introduced into the ground G. According to various embodiments, the wireless communication circuit may be the wireless communication circuit 192 of FIG. 1, the wireless communication circuit 940 of FIG. 9, the wireless communication circuit 1080 of FIG. 10, the wireless communication circuit 1180 of FIG. 11, or the wireless communication circuit 1280 of FIG. 12. According to various embodiments, the at least one first conducive portion 1431 of the hinge structure 1430 may include the hinge cover 533 of FIG. 6, the at least a part of the hinge structure 800 of FIG. 7, the at least one first conductive portion 910 of FIG. 9, the one or more first conductive portions 1030*a* and 1030*b* of FIG. 10, the one or more first conductive portions 1010*a* and 1130*b* of FIG. 11, or the one or more first conductive portions 1230*a* and 1230*b* of FIG. 12.

Referring to FIGS. 13 and 14A, in an embodiment, when the unfolded state of the electronic device 1400 is identified, in operation 1305, the wireless communication circuit and the at least one second conductive portion 1411 of the side member may be electrically connected to each other. The at least one second conductive portion 1411 may be electrically connected to the ground G of the electronic device 1400. A current may be fed (F) from the wireless communication circuit to the at least one second conductive portion 1411, and a transmission line that may transmit or receive wireless electromagnetic waves may be formed as the current is delivered along the at least one second conductive portion 1411 and is introduced into the ground G. According to various embodiments, the at least one second conductive portion 1411 may include the hinge cover 533 of FIG. 6, the at least one second conductive portion 920 of FIG. 9, the second conductive portion 1011*a*, 1021*a*, or 1131 of FIG. 10, the second conductive portion 1111*a*, 1121*a*, or 1131 of FIG. 11, or the second conductive portion 1211*a*, 1211*b*, 1221*b*, or 1231 of FIG. 12.

In an embodiment, referring to FIG. 14B, the at least one first conductive portion 1431 of the hinge structure 1430 may be utilized as an antenna in the folded state of the electronic device 1400. For example, referring to FIG. 15, 1501 denotes an antenna radiation performance in a state, in which the electronic device is unfolded when the at least one first conductive portion of the hinge structure is utilized as an antenna, and 1502 denotes an antenna radiation performance in a state, in which the electronic device is folded when the at least one first conductive portion of the hinge structure is utilized as an antenna. It can be seen from 1501 and 1502 that, in a communication mode that utilizes a frequency band of about 2.2 to 2.7 GHz, the at least one first conductive portion of the hinge structure may be utilized as an antenna that may secure an antenna radiation performance in the folded state of the electronic device.

In an embodiment, referring to FIG. 14A, the at least one second conductive portion 1411 of the side member may be utilized as an antenna in the unfolded state of the electronic device 1400. For example, referring to FIG. 16, 1601 denotes an antenna radiation performance in the folded state of the electronic device when the at least one second conductive portion of the side member is utilized as an antenna, and 1602 denotes an antenna radiation performance in the unfolded state of the electronic device when the at least one second conductive portion of the side member is utilized as an antenna. It can be seen from 1501 and 1602 that, in a communication mode that utilizes a frequency band of about 2.2 to 2.7 GHz, the at least one second conductive portion of the side member may be utilized as an antenna that may secure an antenna radiation performance in the unfolded state of the electronic device.

According to various embodiments, based on the technical spirit of the various embodiments of the disclosure, electronic devices of various other rotation types (e.g., a slide type, a swivel type, and the like), in which at least two housings are operated to be rotatable by a connector.

According to an embodiment of the disclosure, an electronic device (e.g., the electronic device 20 of FIG. 2) may include a foldable housing (e.g., the foldable housing 200 of FIG. 2). The foldable housing may include a hinge structure (e.g., the hinge structure 800) including at least one first conductive portion (e.g., the at least one first conductive portion 910 of FIG. 9), a first housing structure 210 (e.g., the first housing structure 210 of FIG. 1) connected to the hinge structure, and including a first surface (e.g., the first surface 2001 of FIG. 1) oriented in a first direction (e.g., the first direction 201 of FIG. 2), a second surface (e.g., the second surface 2002 of FIG. 2) oriented in a second direction (e.g., the second direction 202 of FIG. 2) that is opposite to the first direction, and a first side member (e.g., the side member 211 of FIG. 2) surrounding at least a part a space between the first surface and the second surface and including at least one second conductive portion (e.g., the second conductive portion 920 of FIG. 9), and a second housing structure (e.g., the second housing structure 220 of FIG. 2) connected to the hinge structure, and including a third surface (e.g., the third surface 2003 of FIG. 2) oriented in a third direction (e.g., the third direction 203 of FIG. 2), a fourth surface (e.g., the fourth surface 2004 of FIG. 2) oriented in a fourth direction (e.g., the fourth direction 204 of FIG. 2) that is opposite to the third direction, and a second side member (e.g., the second side member 221 of FIG. 2) surrounding at least a part of a space between the third surface and the fourth surface, the second housing structure being foldable with respect to the first housing structure about the hinge structure. The first surface faces the third surface in the folded state and the third direction is identical to the first direction in the unfolded state. The electronic device may include a flexible display (e.g., the display 300 of FIG. 2) extending from the first surface to the third surface. The electronic device may include a wireless communication circuit (e.g., the wireless communication circuit 940 of FIG. 9) electrically connected to the first conductive portion in the folded state and electrically connected to the second conductive portion in the unfolded state, and configured to transmit and/or receive a signal having a selected frequency.

According to an embodiment of the disclosure, the electronic device (e.g., the electronic device 900 of FIG. 9) may include a switch (e.g., the switch 982 of FIG. 9) including a first terminal (e.g., the first terminal 9821 of FIG. 9), a second terminal (e.g., the second terminal 9822 of FIG. 9), and a third terminal (e.g., the third terminal 9823 of FIG. 9). The first terminal may be electrically connected to the wireless communication circuit (e.g., the wireless communication circuit 940 of FIG. 9), the second terminal may be electrically connected to the first conductive portion (e.g., the at least one first conductive portion 910 of FIG. 9), and the third terminal may be electrically connected to the second conductive portion (e.g., the at least one second conductive portion 920 of FIG. 9). The switch may be configured to electrically connect the wireless communication circuit and the first conductive portion in the folded state, and electrically connects the wireless communication circuit and the second conductive portion in the unfolded state.

According to an embodiment, the electronic device (e.g., the electronic device 900 of FIG. 9) may include a processor (e.g., the processor 981 of FIG. 9) electrically connected to the flexible display (e.g., the display 400 of FIG. 3), the wireless communication circuit (e.g., the wireless communication circuit 940 of FIG. 9), and the switch (e.g., the switch 982 of FIG. 9). The processor may identify, based on information acquired by at least one sensor (e.g., the at least one sensor 960 of FIG. 9) disposed in the electronic device, the folded state or the unfolded state to control the switch.

According to an embodiment of the disclosure, the first side member (e.g., the first side member 211 of FIG. 2) is coupled to the second surface (e.g., the second surface 2002 of FIG. 2) or integrally formed with the second surface. The second side member (e.g., the second side member 221 of FIG. 2) is coupled to the fourth surface or integrally formed with the fourth surface (e.g., the fourth surface 2004 of FIG. 3).

According to an embodiment, the hinge structure (e.g., the hinge structure 800 of FIG. 7) may further include a hinge cover (e.g., the hinge cover 830 of FIG. 7) that covers a foldable portion of the foldable housing (e.g., the foldable housing 200 of FIG. 2). The hinge cover may include the at least one first conductive portion (e.g., the at least one first conductive portion 910 of FIG. 9).

According to an embodiment of the disclosure, at least a part of the hinge cover (e.g., the hinge cover 230 of FIG. 2)

is covered by the first housing structure (e.g., the first housing structure 210) and the second housing structure (e.g., the second housing structure 220 of FIG. 2) in the unfolded state. The at least a part of the hinge cover may be exposed between the first housing structure and the second housing structure in the folded state.

According to an embodiment of the disclosure, the electronic device (e.g., the electronic device 500 of FIG. 5) may include a flexible conductive member (e.g., the conductive member 610 of FIG. 5) disposed in the hinge structure (e.g., the hinge structure 530 of FIG. 5), and electrically connected to the wireless communication circuit (e.g., the wireless communication circuit 940 of FIG. 9). The flexible conductive member may be electrically connected to the at least one first conductive portion (e.g., the hinge cover 533 of FIG. 6) when the unfolded state is changed to the folded state.

According to an embodiment of the disclosure, a distance between the flexible conductive member (e.g., the conductive member 610 of FIG. 5 or 6) and the at least one first conductive portion (e.g., the hinge cover 533 of FIG. 5 or 6) may be a first distance in the unfolded state, and may be a second distance that is smaller than the first distance in the folded state.

According to an embodiment of the disclosure, the flexible conductive member (e.g., the conductive member 610 of FIG. 5 or 6) may include at least one of a C clip, a pogo pin, a spring, conductive poron, conductive rubber, or a conductive tape.

According to an embodiment of the disclosure, the hinge structure (e.g., the hinge structure 800 of FIG. 7) may include a conductive first hinge plate (e.g., the first hinge plate 531 of FIG. 5 or 6 or the first hinge plate 810 of FIG. 7) connected to the first housing structure, a conductive second hinge plate (e.g., the second hinge plate 532 of FIG. 5 or 6 or the second hinge plate 820 of FIG. 7) connected to the second housing structure, and at least one hinge (e.g., the at least one hinge 840 of FIG. 7) connecting the first hinge plate and the second hinge plate. At least one of the first hinge plate, the second hinge plate, or the at least one hinge may include the at least one conductive portion (e.g., the at least one first conductive portion 910 of FIG. 9)

According to an embodiment, the first hinge plate (e.g., the first hinge plate 810 of FIG. 7) and the second hinge plate (e.g., the second hinge plate 820 of FIG. 7) may be electrically connected to each other through the at least one hinge (e.g., the at least one hinge 840 of FIG. 7).

According to an embodiment of the disclosure, the hinge cover (e.g., the hinge cover 830 of FIG. 7) may be electrically connected to the hinge (e.g., the at least one hinge 840 of FIG. 7).

According to an embodiment of the disclosure, the hinge cover (e.g., the hinge cover 830 of FIG. 7) and the hinge (e.g., the at least one hinge 840 of FIG. 7) may be electrically connected to each other by at least one bolt that couples the hinge cover and the hinge.

According to an embodiment of the disclosure, the electronic device (e.g., the electronic device 900 of FIG. 9) may include a ground (e.g., the ground 930 of FIG. 9) electrically connected to the at least one first conductive portion (e.g., the at least one first ground 910 of FIG. 9) and the at least one second conductive portion (e.g., the at least one second conductive portion 920 of FIG. 9).

According to an embodiment of the disclosure, the at least one second side member (e.g., the second side member 221 of FIG. 2) may include at least one third conductive portion (e.g., the third conductive portion 1012a, 1012b, 1022a, 1022b, or 1032 of FIG. 10), and in the folded state, the at least one second conductive portion (e.g., the second conductive portion 1011a, 1011b, 1021a, 1021b or 1031) and the at least one third conductive portion may be arranged to face each other.

According to an embodiment of the disclosure, the at least one second conductive portion may include a plurality of second conductive portions that are physically separated from each other while a first nonconductive member being interposed therebetween, and the at least one third conductive portion may include a plurality of third conductive portions that are physically separated from each other while a second nonconductive member being interposed therebetween. The first nonconductive member and the second nonconductive member are aligned in the folded state.

According to an embodiment of the disclosure, an electronic device (e.g., the electronic device 20 of FIG. 2) may include a foldable housing (e.g., the foldable housing 200 of FIG. 2). The foldable housing may include a hinge structure (e.g., the hinge structure 800 of FIG. 7) including a hinge cover (e.g., the hinge cover 230 of FIG. 2) that covers a foldable part of the foldable housing, a first housing structure (e.g., the first housing structure 210 of FIG. 2) connected to the hinge structure and including a first surface (e.g., the first surface 2001 of FIG. 2) oriented in a first direction (e.g., the first direction 201 of FIG. 2), a second surface (e.g., the second surface 2002 of FIG. 2) oriented in a second direction (e.g., the second direction 202 of FIG. 2) that is opposite to the first direction, and a first side member (e.g., the first side member 211 of FIG. 2) surrounding at least a part of a space between the first surface and the second surface, and including at least one second conductive portion (e.g., the second conductive portion 920 of FIG. 9), and a second housing structure (e.g., the second housing structure 220 of FIG. 2) connected to the hinge structure and including a third surface (e.g., the third surface 2003 of FIG. 2) oriented in a third direction (e.g., the third direction 203 of FIG. 2), a fourth surface (e.g., the fourth surface 2004 of FIG. 4) oriented in a fourth direction (e.g., the fourth direction 204 of FIG. 2) that is opposite to the third direction, and a second side member (e.g., the second side member 221 of FIG. 2) surrounding at least a part of a space between the third surface and the fourth surface, and being foldable with respect to the first housing structure about the hinge structure. The first surface may face the third surface in a folded state of the foldable housing and the third direction is identical to the first direction in an unfolded state of the foldable housing. The electronic device may include a flexible display (e.g., the display 300 of FIG. 2) extending from the first surface to the third surface. The electronic device may include a wireless communication circuit (e.g., the wireless communication circuit 940 of FIG. 9) electrically connected to the hinge cover in the folded state and electrically connected to the conductive portion in the unfolded state, and configured to transmit and/or receive a signal having a selected frequency.

According to an embodiment of the disclosure, the hinge cover (e.g., the hinge cover 230 of FIG. 2) may be covered by the first housing structure and the second housing structure in the unfolded state so as not to be or to be minimally exposed, and may be maximally exposed between the first housing structure and the second housing structure in the folded state.

According to an embodiment of the disclosure, the electronic device may include a flexible conductive member (e.g., the conductive member 610 of FIG. 5) disposed in the hinge structure (e.g., the hinge structure 530 of FIG. 5), and electrically connected to the wireless communication circuit (e.g., the wireless communication circuit 940 of FIG. 9). The flexible conductive member may be electrically connected to the hinge cover (e.g., the hinge cover 533 of FIG. 5) when state of the electronic device is changed from the unfolded state to the folded state.

According to an embodiment of the disclosure, the hinge structure (e.g., the hinge structure 800 of FIG. 7) may include a conductive first hinge plate (e.g., the first hinge plate 531 of FIG. 5 or 6 or the first hinge plate 810 of FIG. 7) connected to the first housing structure, a conductive second hinge plate (e.g., the second hinge plate 532 of FIG. 5 or 6 or the second hinge plate 820 of FIG. 7) connected to the second housing structure, and at least one hinge (e.g., the at least one hinge 840 of FIG. 7) connecting the first hinge plate and the second hinge plate. The hinge cover may be electrically connected to at least one of the first hinge plate, the second hinge plate, or the least one hinge.

According to an embodiment of the disclosure, the electronic device may include a switch (e.g., the switch 982 of FIG. 9) including a first terminal (e.g., the first terminal 9821 of FIG. 9), a second terminal (e.g., the second terminal 9822 of FIG. 9), and a third terminal (e.g., the third terminal 9823 of FIG. 9). The first terminal may be electrically connected to the wireless communication circuit (e.g., the wireless communication circuit 940 of FIG. 9), the second terminal may be electrically connected to the hinge cover (e.g., the hinge cover 533 of FIG. 5), and the third terminal may be electrically connected to the second conductive portion (e.g., the at least one second conductive portion 920 of FIG. 9). The switch may be configured to electrically connect the wireless communication circuit and the first conductive portion in the folded state, and electrically connects the wireless communication circuit and the second conductive portion in the unfolded state.

The embodiments disclosed in the disclosure disclosed in the specification and the drawings simply suggest specific examples to easily describe the technical contents according to the embodiments disclosed in the disclosure and help understanding of the embodiments disclosed in the disclose, and are not intended to limit the scopes of the embodiments disclosed in the disclosure. Accordingly, it should be construed that the scopes of the various embodiments disclosed in the disclosure include all changes or modifications deduced based on the technical spirits of the various embodiments disclosed in the disclosure, in addition to the embodiments disclosed herein.

The invention claimed is:

1. An electronic device comprising:
a foldable housing comprising:
a hinge structure comprising at least one first conductive portion,
a first housing structure connected to the hinge structure, and comprising a first surface oriented in a first direction, a second surface oriented in a second direction that is opposite to the first direction, and a first side member surrounding at least a part of a space between the first surface and the second surface and comprising at least one second conductive portion, and
a second housing structure connected to the hinge structure, and comprising a third surface oriented in a third direction, a fourth surface oriented in a fourth direction that is opposite to the third direction, and a second side member surrounding at least a part of a space between the third surface and the fourth surface, the second housing structure being foldable with respect to the first housing structure about the hinge structure,
wherein the foldable housing is configured such that the first surface faces the third surface in a folded state of the foldable housing and the third direction is identical to the first direction in an unfolded state of the foldable housing;
a flexible display extending from the first surface to the third surface; and
a wireless communication circuit electrically connected to the first conductive portion in the folded state and electrically connected to the second conductive portion in the unfolded state, and configured to at least one of transmit or receive a signal having a selected frequency.

2. The electronic device of claim 1, further comprising:
a switch comprising a first terminal, a second terminal, and a third terminal,
wherein the first terminal is electrically connected to the wireless communication circuit,
wherein the second terminal is electrically connected to the first conductive portion,
wherein the third terminal is electrically connected to the second conductive portion, and
wherein the switch electrically connects the wireless communication circuit and the first conductive portion in the folded state, and electrically connects the wireless communication circuit and the second conductive portion in the unfolded state.

3. The electronic device of claim 2, further comprising:
a processor electrically connected to the flexible display, the wireless communication circuit, and the switch,
wherein the processor is configured to identify, based on information acquired by at least one sensor disposed in the electronic device, the folded state or the unfolded state to control the switch.

4. The electronic device of claim 1,
wherein the first side member is coupled to the second surface or integrally formed with the second surface, and
wherein the second side member is coupled to the fourth surface or integrally formed with the fourth surface.

5. The electronic device of claim 1,
wherein the hinge structure comprises a hinge cover that covers a foldable portion of the foldable housing, and
wherein the hinge cover comprises the at least one first conductive portion.

6. The electronic device of claim 5, wherein at least a part of the hinge cover is covered by the first housing structure and the second housing structure in the unfolded state, and is exposed between the first housing structure and the second housing structure in the folded state.

7. The electronic device of claim 5, further comprising:
a flexible conductive member disposed in the hinge structure, and electrically connected to the wireless communication circuit,
wherein the flexible conductive member is electrically connected to the at least one first conductive portion when the unfolded state is changed to the folded state.

8. The electronic device of claim 7, wherein the flexible conductive member comprises at least one of a C clip, a pogo pin, a spring, conductive poron, conductive rubber, or a conductive tape.

9. The electronic device of claim 1,
wherein the hinge structure further comprises:
a conductive first hinge plate connected to the first housing structure;

a conductive second hinge plate connected to the second housing structure; and
at least one hinge connecting the first hinge plate and the second hinge plate, and
wherein at least one of the first hinge plate, the second hinge plate, or the at least one hinge comprises a first conductive portion.

10. The electronic device of claim 9, wherein the first hinge plate and the second hinge plate are electrically connected to each other through the at least one hinge.

11. The electronic device of claim 9, wherein the hinge cover is electrically connected to the hinge.

12. The electronic device of claim 11, wherein the hinge cover and the hinge are electrically connected to each other through at least one bolt that couples the hinge cover and the hinge.

13. The electronic device of claim 1, further comprising:
a ground electrically connected to the at least one first conductive portion and the at least one second conductive portion.

14. The electronic device of claim 1,
wherein the second side member comprises at least one third conductive portion, and
wherein the at least one second conductive portion and the at least one third conductive portion are disposed to face each other in the folded state.

15. The electronic device of claim 14,
wherein the at least one second conductive portion comprises a plurality of second conductive portions that are physically separated from each other while a first nonconductive member being interposed therebetween,
wherein the at least one third conductive portion comprises a plurality of third conductive portions that are physically separated from each other while a second nonconductive member being interposed therebetween, and
wherein the first nonconductive member and the second nonconductive member are aligned in the folded state.

* * * * *